(12) United States Patent
Omoto

(10) Patent No.: US 8,779,657 B2
(45) Date of Patent: Jul. 15, 2014

(54) ORGANIC EL DISPLAY UNIT AND ELECTRONIC APPARATUS

(71) Applicant: Sony Corporation, Tokyo (JP)

(72) Inventor: Keisuke Omoto, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 14/063,668

(22) Filed: Oct. 25, 2013

(65) Prior Publication Data

US 2014/0049154 A1    Feb. 20, 2014

Related U.S. Application Data

(63) Continuation of application No. 13/313,743, filed on Dec. 7, 2011, now Pat. No. 8,569,957.

(30) Foreign Application Priority Data

Jan. 6, 2011  (JP) .................................. 2011-000940

(51) Int. Cl.
*H05B 33/00*   (2006.01)

(52) U.S. Cl.
USPC .................... 313/504; 313/512; 315/169.3

(58) Field of Classification Search
USPC ..................... 313/504–512; 315/169.1, 169.3
See application file for complete search history.

(56) References Cited

U.S. PATENT DOCUMENTS

| 6,798,132 | B2 | 9/2004 | Satake |
| 7,932,669 | B2 | 4/2011 | Chan et al. |
| 2007/0057624 | A1 | 3/2007 | Angelopoulos et al. |
| 2007/0102737 | A1 | 5/2007 | Kashiwabara et al. |

FOREIGN PATENT DOCUMENTS

JP    2008-218427    9/2008

*Primary Examiner* — Joseph L Williams
(74) *Attorney, Agent, or Firm* — Rader, Fishman & Grauer PLLC

(57) ABSTRACT

An organic EL display unit applying a bottom-emission structure which takes light emitted from organic EL devices from the reverse side of a substrate on which pixel circuits are formed, includes: a color filter formed on the pixel circuit; and a metal wiring formed so as to surround the periphery of the color filter, wherein the metal wiring is set to an anode potential of the organic EL device.

6 Claims, 18 Drawing Sheets

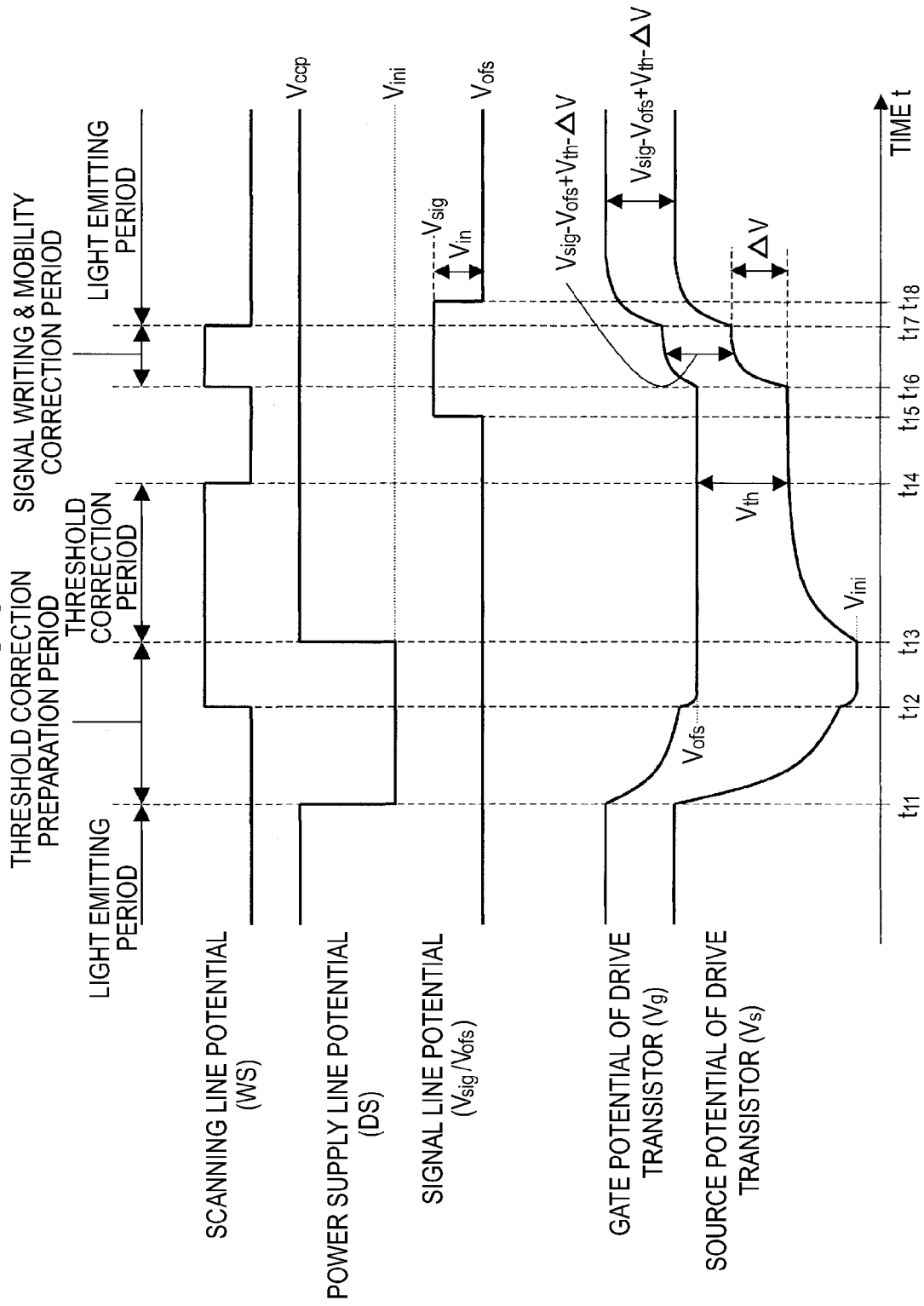

PREVIOUS TO t=t₁₁ t=t₁₁ t=t₁₂ t=t₁₃ t=t₁₄ t=t₁₅ t=t₁₆ t=t₁₇

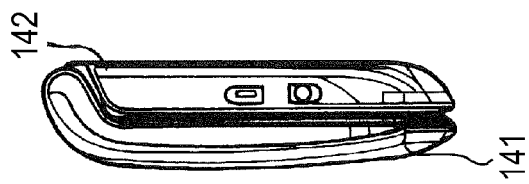
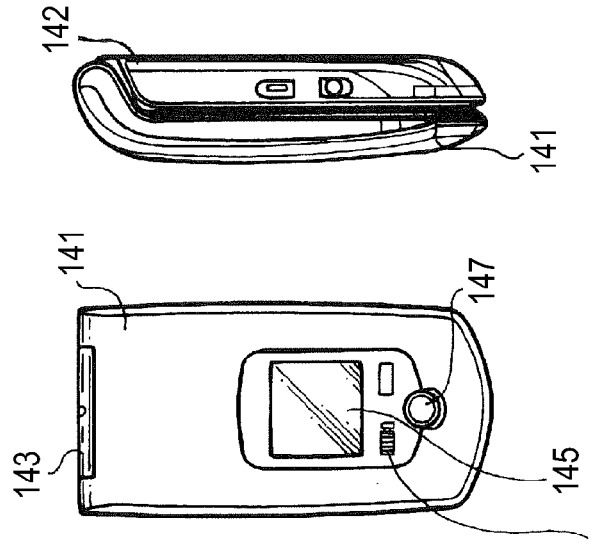
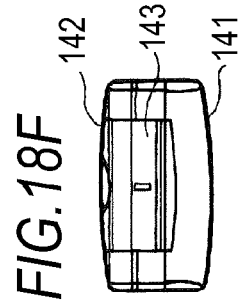
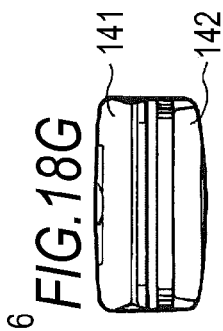
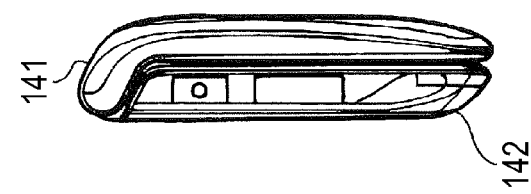
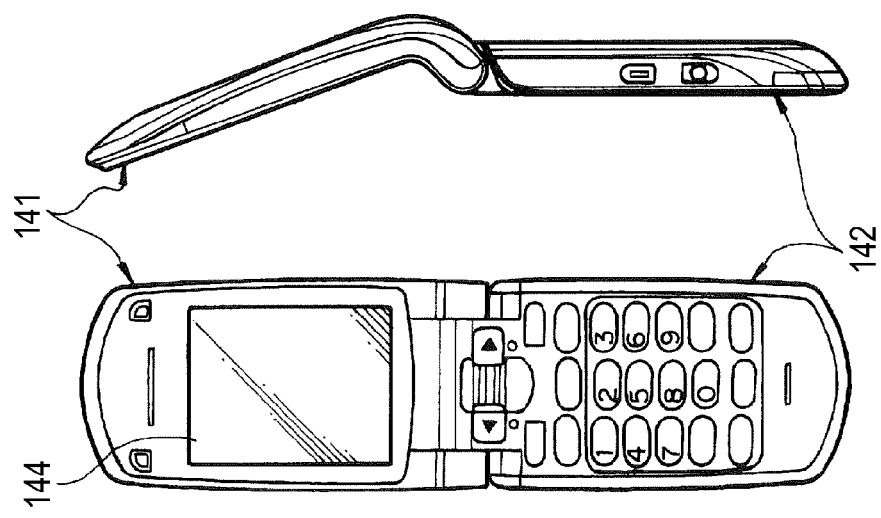

ORGANIC EL DISPLAY UNIT AND ELECTRONIC APPARATUS

CROSS REFERENCES TO RELATED APPLICATIONS

This is a Continuation application of U.S. patent application Ser. No. 13/313,743, filed Dec. 7, 2011, which claims priority to Japanese Patent Application JP 2011-000940 filed with the Japanese Patent Office on Jan. 6, 2011, the entire contents of which being incorporated herein by reference.

FIELD

The present disclosure relates to an organic EL display unit and an electronic apparatus, and particularly relates to an organic EL display unit using a bottom-emission method as a method of taking light emitted from organic EL devices, and an electronic apparatus having the organic EL display unit.

BACKGROUND

As one of flat-panel type display units, there is a display unit using a so-called current-driven electro-optic device in which light emission luminance varies in accordance with a current value flowing in the device as a light emitting portion (light emitting device) of a pixel. An organic EL device is known as the current-driven electro-optic device, which uses electroluminescence (EL) of an organic material and utilizes a phenomenon that an organic thin film emits light when an electric field is impressed.

An organic EL display unit using the organic EL device as the light emitting portion of the pixel has the following characteristics. That is, the organic EL device consumes low power as it can be driven by an application voltage of 10V or less. As the organic EL device is a self-luminous device, visibility of images is higher than a liquid crystal display unit, and further, the organic EL device can be light in weight as well as can be thin in thickness as an illumination member such as a backlight is not necessary. Moreover, response speed is extremely high in the organic EL device, which is several μsec, no residual image is generated at the time of displaying moving pictures.

In the organic EL display unit, a bottom-emission method is known as a method of taking light emitted by the organic EL devices, in which light is taken from the backside of a substrate on which pixel circuits each including a thin-film transistor (TFT), a capacitor device and so on are formed (for example, see JP-A-2008-218427 (Patent Document 1)). When color filters are mounted on the bottom-emission type organic EL display unit, for example, a structure of forming color filters on the pixel circuits formed on the substrate is applied.

SUMMARY

In the bottom-emission type (structure) organic EL display unit, internal resistance of the color filter may vary according to a material of the color filter by receiving light emission of a self-pixel when light emitted from the organic EL device is transmitted through the color filter. The pixel circuit is formed under the color filter in the bottom-emission type organic EL display unit, therefore, variation of internal resistance in the color filter affects circuit operations of the pixel circuit when the internal resistance of the color filter varies.

In view of the above, it is desirable to provide an organic EL display unit and an electronic apparatus having the organic EL display unit which can suppress adverse effect caused by variation of internal resistance of the color filter with respect to circuit operations of the pixel circuit when applying the bottom emission method.

An embodiment of the present disclosure is directed to an organic EL display unit applying a bottom-emission structure which takes light emitted from organic EL devices from the reverse side of a substrate on which pixel circuits are formed, which includes a color filter formed on the pixel circuit and a metal wiring formed so as to surround the periphery the color filter, in which the metal wiring is set to an anode potential of the organic EL device.

In the organic EL display unit having the above configuration, the color filter can be equivalently shown as a parallel circuit including a capacitive component and an impedance component connected in parallel. Then, when the periphery of the color filter is surrounded by the metal wiring set to the anode potential, both terminals of the equivalent circuit of the color filter have electrically the same potential. Therefore, even when internal resistance of the color filter varies by receiving light emission of a self-pixel, the variation of the internal resistance of the color filter does not affect circuit operations of the pixel circuit as both terminals of the equivalent circuit have the same potential.

According to the embodiment of the present disclosure, when the internal resistance of the color filter varies by receiving light emission of the self-pixel in the organic EL display unit applying the bottom-emission method, adverse effect caused by variation of internal resistance of the color filter with respect to the circuit operations of the pixel circuit can be suppressed.

BRIEF DESCRIPTION OF THE DRAWINGS

FIG. 3 is a timing waveform diagram for explaining basic circuit operations of the organic EL display unit to which the present disclosure is applied;

FIGS. 15A and 15B are perspective views showing appearance of a digital camera to which the present disclosure is applied, in which FIG. 15A is a perspective view seen from the front side and FIG. 15B is a perspective view seen from the back side;

FIGS. 18A to 18G are appearance views of a cellular phone device to which the present disclosure is applied, in which FIG. 18A is a front view in an opened state, FIG. 18B is a side view thereof, FIG. 18C is a front view in a closed state, FIG. 18D is a left-side view, FIG. 18E is a right-side view, FIG. 18F is an upper surface view and FIG. 18G is a bottom surface view.

DETAILED DESCRIPTION

Hereinafter, a mode for carrying out the present disclosure (hereinafter referred to as "embodiment") will be explained in detail with reference to the drawings. The explanation will be made in the following order.

1. Organic EL display unit to which the present disclosure is applied
  1-1. System configuration
  1-2. Basic circuit operations
  1-3. Bottom-emission structure
  1-4. Problems caused by variation of internal resistance of a color filter
2. Explanation of an embodiment
2-1. Pixel configuration according to the embodiment
2-2. Operation and effect of the embodiment
3. Application example
4. Electronic apparatus

1. Organic EL Display Unit to which the Present Disclosure is Applied

[1-1. System Configuration]

Figure 1:
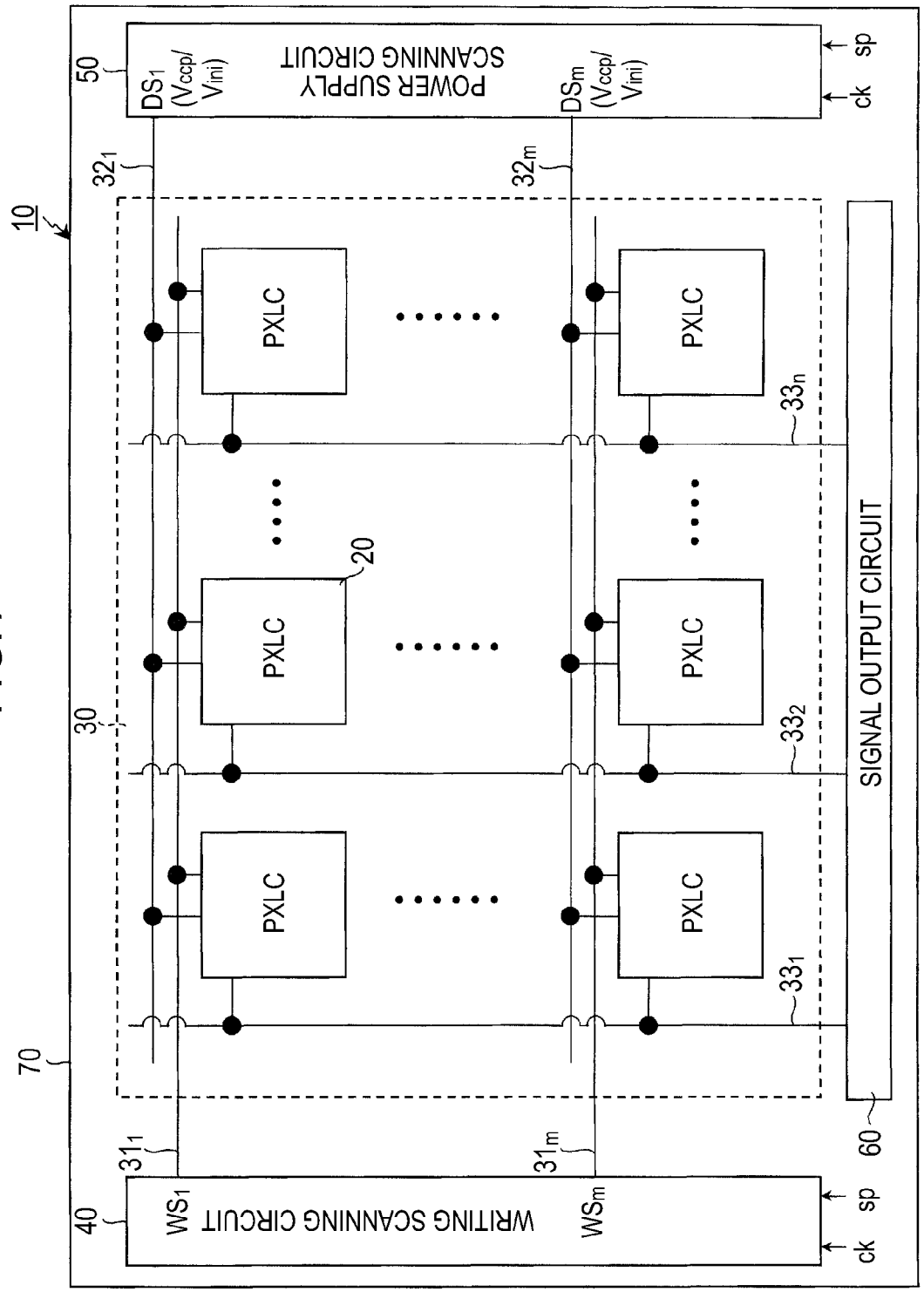
FIG. 1 is a system configuration diagram showing an outline of a configuration of an active-matrix organic EL display unit to which the present disclosure is applied.

FIG. 1 is a system configuration diagram showing an outline of a configuration of an active-matrix organic EL display unit to which the present disclosure is applied.

The active-matrix organic EL display unit is a display unit controlling electric current flowing in an organic EL device which is a current-driven electro-optic device by an active device, for example, an insulating-gate field effect transistor provided in the same pixel where the organic EL device is provided. As an insulating-gate field effect transistor, a TFT (thin-film transistor) is typically used.

As shown in FIG. 1, an organic EL display unit 10 according to the application example includes plural pixels 20 having organic EL devices, a pixel array section 30 in which the pixels 20 are two-dimensionally arranged in a matrix state and a drive circuit unit arranged in the periphery of the pixel array section 30. The drive circuit unit includes a writing scanning circuit 40, a power supply scanning circuit 50, a signal output circuit 60 and so on, which drives respective pixels 20 in the pixel array section 30.

Here, when the organic EL display unit 10 supports color display, one pixel (unit pixel) to be a unit for forming a color image includes plural sub-pixels, and each sub-pixel corresponding to the pixel 20 of FIG. 1. More specifically, one pixel includes three sub-pixels which are, for example, a sub-pixel emitting red (R) light, a sub-pixel emitting green (G) light and a sub-pixel emitting blue (B) light in the display unit supporting color display.

However, one pixel is not limited to be formed by a combination of sub-pixels of three primary colors RGB but it is also possible to add sub-pixels of one or plural colors to the sub-pixels of three primary colors to form one pixel. More specifically, for example, it is possible to add a sub-pixel emitting white (W) light to form one pixel for improving luminance or to add at least one sub-pixel emitting light of a complementary color to form one pixel for expanding a color reproduction range.

In the pixel array section 30, scanning lines $31_1$ to $31_m$ and power supply lines $32_1$ to $32_m$ are arranged at respective pixel rows along a row direction (arrangement direction of pixels in pixel rows) with respect to arrangement of pixels 20 of m-rows and n-columns. Furthermore, signal lines $33_1$ to $33_n$ are arranged at respective pixel columns along a column direction (arrangement direction of pixels in pixel columns) with respect to arrangement of pixels 20 of m-rows and n-columns.

The scanning lines $31_1$ to $31_m$ are respectively connected to output terminals of corresponding rows of the writing scanning circuit 40. The power supply lines $32_1$ to $32_m$ are respectively connected to output terminals of corresponding rows of the power supply scanning circuit 50. The signal lines $33_1$ to $33_n$ are respectively connected to output terminals of corresponding columns of the signal output circuit 60.

The pixel array section 30 is normally formed on a transparent insulating substrate such as a glass substrate. Thus, the organic EL display unit 10 has a flat type panel structure. The drive circuits of respective pixels 20 in the pixel array section 30 can be formed by using an amorphous silicon TFT or a low-temperature polysilicon TFT. When using the low-temperature polysilicon TFT, the writing scanning circuit 40, the power supply scanning circuit 50 and the signal output circuit 60 can be also mounted on a display panel (substrate) 70 on which the pixel array section 30 is formed as shown in FIG. 1.

The writing scanning circuit 40 includes a shift register circuit sequentially shifting (transfers) a start pulse "sp" in synchronization with a clock pulse "ck" and so on. The writing scanning circuit 40 sequentially supplies writing scanning signals WS ($WS_1$ to $WS_m$) to the scanning lines 31 ($31_1$ to $31_m$) when writing a signal voltage of a video signal to respective pixels 20 in the pixel array section 30, thereby sequentially scanning (line-sequential scanning) respective pixels 20 in the pixel array section 30 on a row basis.

The power supply scanning circuit 50 includes the shift register circuit sequentially shifting the start pulse "sp" in synchronization with a clock pulse "ck" and so on. The power supply scanning circuit 50 supplies power supply potentials DS ($DS_1$ to $DS_m$) which can be switched between a first power supply potential $V_{ccp}$ and a second power supply potential $V_{ini}$ which is lower than the first power supply potential $V_{ccp}$ to the power supply lines 32 ($32_1$ to $32_m$) in synchronization with the line sequential scanning by the writing scanning circuit 40. As described later, light emission/non-light emission of pixels 20 is controlled by switching between $V_{ccp}/V_{ini}$ of the power supply potentials DS.

The signal output circuit 60 selectively outputs a signal voltage $V_{sig}$ of a video signal (hereinafter may be referred to as merely "signal voltage") corresponding to luminance information supplied from a signal supply source (not shown) and a reference voltage $V_{ofs}$. Here, the reference signal $V_{ofs}$ is a potential to be a reference of the signal voltage $V_{sig}$ of the video signal (for example, a potential corresponding to a black-level of the video signal) and used at the time of later-described threshold correction processing.

The signal voltages $V_{sig}$/reference voltage $V_{ofs}$ outputted from the signal output circuit 60 are written in respective pixels 20 in the pixel array section 30 through the signal lines 33 ($33_1$ to $33_n$) on a pixel-row basis selected by scanning by the writing scanning circuit 40. That is, the signal output circuit 60 applies a driving mode of line-sequential writing in which the signal voltage $V_{sig}$ is written on a row (line) basis.

(Pixel Circuit)

Figure 2:
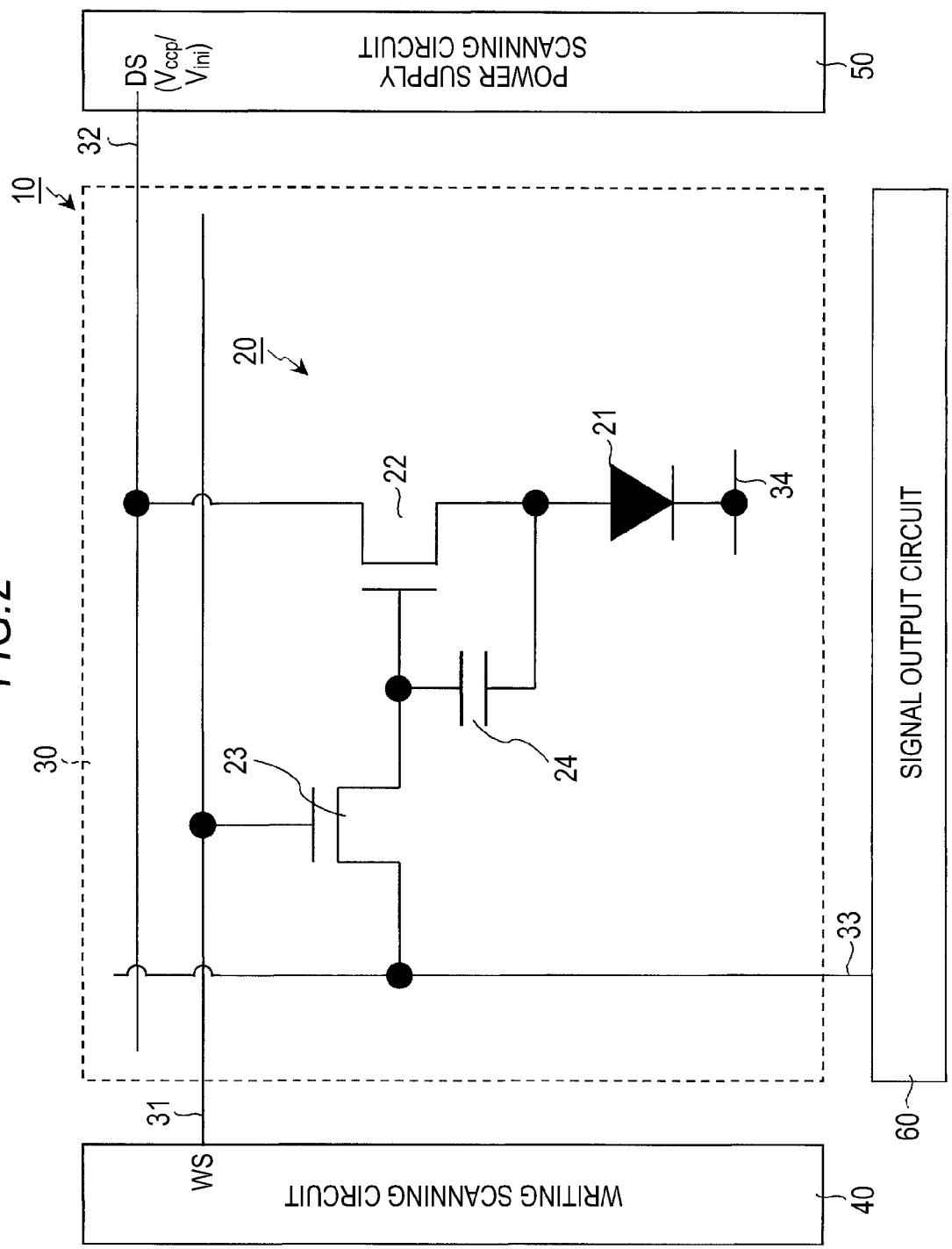
FIG. 2 is a circuit diagram showing an example of a specific circuit configuration of a pixel (pixel circuit)

FIG. 2 is a circuit diagram showing an example of a specific circuit configuration of the pixel (pixel circuit) 20. A light emitting portion of the pixel 20 includes an organic EL device 21 which is a current-driven electro-optic device in which light emission luminance varies in accordance with a current value flowing in the device.

As shown in FIG. 2, the pixel 20 includes the organic EL device 21 and a drive circuit driving the organic EL device 21 by allowing electric current to flow in the organic EL device 21. A cathode electrode of the organic EL device 21 is connected to a common power supply line 34 wired to all pixels in common (so-called plane wiring).

The drive circuit driving the organic EL device 21 includes a drive transistor 22, a write transistor 23 and a storage capacitor 24. As the drive transistor 22 and the write transistor 23, an N-channel TFT can be used. However, a combination of a conductive type of the drive transistor 22 and the write transistor 23 is merely an example and is not limited to the combination.

One electrode (source/drain electrode) of the drive transistor 22 is connected to an anode electrode of the organic EL device 21 and the other electrode (drain/source electrode) thereof is connected to the power supply line 32 ($32_1$ to $32_m$).

One electrode (source/drain electrode) of the write transistor 23 is connected to the signal line 33 ($33_1$ to $33n$) and the other electrode (drain/source electrode) thereof is connected to a gate electrode of the drive transistor 22. A gate electrode of the write transistor 23 is connected to the scanning line 31 ($31_1$ to $31_m$).

In the drive transistor 22 and the write transistor 23, one electrode corresponds to metal wiring electrically connected to a source/drain region and the other electrode corresponds to metal wiring electrically connected to a drain/source region. One electrode can be the source electrode as well as the drain electrode and the other electrode can be the drain electrode as well as the source electrode according to the potential relation between one electrode and the other electrode.

One electrode of the storage capacitor 24 is connected to the gate electrode of the drive transistor 22 and the other electrode thereof is connected to the other electrode of the drive transistor 22 and the anode electrode of the organic EL device 21.

The drive circuit of the organic EL device 21 is not limited to the circuit configuration having two transistors which are the drive transistor 22 and the write transistor 23 and one capacitor device which is the storage capacitor 24. That is, it is possible to apply a circuit configuration, as an example, in which an auxiliary capacitor is provided according to need, which compensates for the lack of capacity in the organic EL device 21 by connecting one electrode to the anode electrode of the organic EL device 21 and connecting the other electrode to a fixed potential.

In the pixel 20 having the above configuration, the write transistor 23 becomes conductive in response to a high-active write scanning signal WS applied to the gate electrode from the writing scanning circuit 40 through the scanning line 31. Thus, the write transistor 23 performs sampling of the signal voltage $V_{sig}$ of the video signal corresponding to luminance information or the reference voltage $V_{ofs}$ supplied from the signal output circuit 60 through the signal line 33 and writes the voltage in the pixel 20. The written signal voltage $V_{sig}$ or the reference signal $V_{ofs}$ is applied to the gate electrode of the drive transistor 22 as well as stored in the storage capacitor 24.

The drive transistor 22 operates in a saturation region in a state where one electrode is the drain electrode and the other electrode is the source electrode when the power supply potential DS of the power supply line 32 ($32_1$ to $32_m$) is in the first power supply potential $V_{ccp}$. Thus, the drive transistor 22 drives the organic EL device 21 to emit light by current driving by receiving current supply from the power supply line 32. More specifically, the drive transistor 22 operates in the saturation region to thereby supply drive current of a current value corresponding to a voltage value of the signal voltage $V_{sig}$ stored in the storage capacitor 24 and drives the organic EL device 21 by current to emit light.

The drive transistor 22 further operates as a switching transistor in a state where one electrode is the source electrode and the other electrode is the drain electrode when the power supply potential DS is switched from the first power supply potential $V_{ccp}$ to the second power supply potential $V_{ini}$. Thus, the drive transistor 22 stops supply of drive current to the organic EL device 21 and allows the organic EL device 21 to be in a non-light emitting state. That is, the drive transistor 22 also has a function of a transistor controlling light emission/non-light emission of the organic EL device 21.

According to the switching operation of the drive transistor 22, a period during which the organic EL device 21 does not emit light (non-light emission period) is provided to thereby control a ratio (duty) of a light emission period and the non-light emission period of the organic EL device 21. The residual image blur caused by light emission of the pixel over one display frame period can be reduced by the duty control, therefore, it is possible to especially improve quality of moving pictures.

In the first and second power supply potentials $V_{ccp}$ and $V_{ini}$ selectively supplied from the power supply scanning circuit 50 through the power supply line 32, the first power supply potential $V_{ccp}$ is a power supply potential for supplying drive current for driving the organic EL device 21 to emit light to the drive transistor 22. The second power supply potential $V_{ini}$ is a power supply potential for applying reverse bias to the organic EL device 21. The second power supply potential $V_{ini}$ is set to a potential lower than the reference voltage $V_{ofs}$, for example, a potential lower than $V_{ofs}-V_{th}$ when a threshold voltage of the drive transistor 22 is $V_{th}$, preferably a potential sufficiently lower than $V_{ofs}-V_{th}$.

[1-2. Basic Circuit Operations]

Subsequently, basic circuit operations of the organic EL display unit 10 having the above configuration will be explained with reference to operation explanation diagrams of FIGS. 4A to 4D and FIGS. 5A to 5D based on a timing waveform diagram of FIG. 3. In the operation explanation diagrams of FIGS. 4A to 4D and FIGS. 5A to 5D, the write transistor 23 is shown by a symbol of a switch for simplifying the drawings. Additionally, an equivalent capacitor 25 of the organic EL device 21 is also shown.

In the timing waveform diagram of FIG. 3, variations of the potential (writing scanning signal) WS of the scanning line 31, the potential (power supply potential) DS of the power supply line 32, the potential ($V_{sig}/V_{ofs}$) of the signal line 33, the gate potential Vg and the source potential Vs of the drive transistor 22 are respectively shown.

(Light Emission Period in a Previous Display Frame)

In the timing waveform diagram of FIG. 3, a period before a time point "t11" is a light emission period of the organic EL device 21 in a previous display frame. In the light emission period in the previous display frame, the potential DS of the power supply line 32 is in the first power supply potential (hereinafter referred to as "high potential") $V_{ccp}$, and the write transistor 23 is in the non-conductive state.

Figure 4A:
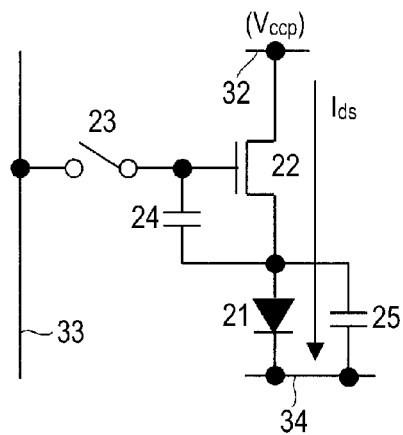
FIGS. 4A to 4D are operation explanation diagrams (No. 1) of basic circuit operations of the organic EL display unit to which the present disclosure is applied.

At this time, the drive transistor 22 is designed to operate in the saturation region. Thus, a drive current (drain-source current) $I_{ds}$ corresponding to the gate-source voltage $V_{gs}$ of the drive transistor 22 is supplied from the power supply line 32 to the organic EL device 21 through the drive transistor 22 as shown in FIG. 4A. Therefore, the organic EL device 21 emits light with luminance corresponding to a current value of the drive current $I_{ds}$.

(Threshold Correction Preparation Period)

Figure 4B:
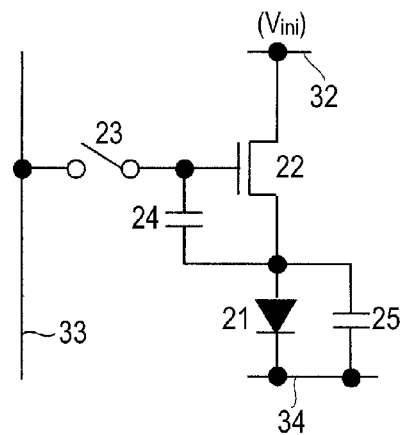

At the time point "t11", the line-sequential scanning enters a new display frame (current display frame). Then, the potential DS of the power supply line 32 is switched from the high potential $V_{ccp}$ to the second power supply potential (hereinafter, referred to as "low potential") $V_{ini}$ which is sufficiently lower than $V_{ofs}$–$V_{th}$ with respect to the reference voltage $V_{ofs}$ of the signal line 33 as shown in FIG. 4B.

Here, a threshold voltage of the organic EL device 21 is $V_{thel}$ and a potential of the common power supply line 34 (cathode potential) is $V_{cath}$. At this time, when the low potential $V_{ini}$ is lower than $V_{thel}$+$V_{cath}$ the source potential Vs of the drive transistor 22 is approximately equal to the low potential $V_{ini}$, therefore, the organic EL device 21 becomes in the reverse bias state and stops light emission.

Figure 4C:
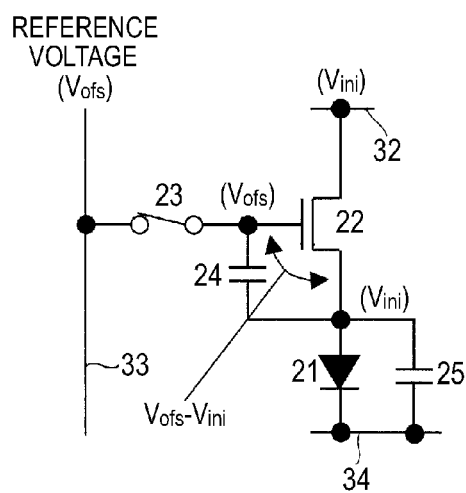

Next, when the potential WS of the scanning line 31 is changed from the low potential side to the high potential side at a time point "t12", the write transistor 23 becomes conductive as shown in FIG. 4C. As the reference voltage $V_{ofs}$ is supplied from the signal output circuit 60 to the signal line 33 at this time, the gate potential Vg of the drive transistor 22 becomes in the reference voltage $V_{ofs}$. The source voltage Vs of the drive transistor 22 is in the potential sufficiently lower than the reference voltage $V_{ofs}$, namely, in the low potential $V_{ini}$.

At this time, the gate-source voltage $V_{gs}$ of the drive transistor 22 is $V_{ofs}$–$V_{ini}$. Here, it is difficult to perform later-described threshold correction processing unless $V_{ofs}$–$V_{ini}$ is higher than the threshold voltage $V_{th}$ of the drive transistor 22, therefore, it is necessary to set the potential relation to $V_{ofs}$–$V_{ini}$>$V_{th}$.

As described above, the processing of fixing the gate potential Vg of the drive transistor 22 to the reference voltage $V_{ofs}$ as well as fixing (determining) the source potential Vs to the low potential $V_{ini}$ to be initialized is preparation processing (threshold correction preparation) before performing later-described threshold correction processing (threshold correction operation). Therefore, the reference voltage $V_{ofs}$ and the low potential $V_{ini}$ are respective initialization potentials of the gate potential Vg and the source potential Vs of the drive transistor 22.

(Threshold Correction Period)

Figure 4D:
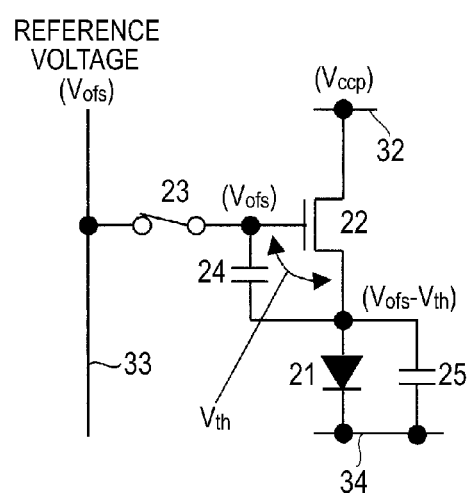

Next, when the potential DS of the power supply line 32 is switched from the low potential $V_{ini}$ to the high potential $V_{ccp}$ at a time point "t13" as shown in FIG. 4D, the threshold correction processing is started in a state where the gate potential Vg of the drive transistor 22 is maintained to the reference voltage $V_{ofs}$. That is, the source potential Vs of the drive transistor 22 starts to increase toward a potential obtained by subtracting the threshold voltage Vth of the drive transistor 22 from the gate potential Vg.

Here, processing of changing the source potential Vs toward the potential obtained by subtracting the threshold voltage Vth of the drive transistor 22 from the initialization potential $V_{ofs}$ based on the initialization potential $V_{ofs}$ of the gate potential Vg of the drive transistor 22 is referred to as the threshold correction processing for convenience. As the threshold correction processing proceeds, the gate-source voltage $V_{gs}$ of the drive transistor 22 finally converges to the threshold voltage $V_{th}$ of the drive transistor 22. The voltage corresponds to the threshold voltage $V_{th}$ is stored in the storage capacitor 24.

In the period during which the threshold correction processing is performed (threshold correction period), the potential $V_{cath}$ of the common power supply line 34 is set so that the organic EL device 21 is in a cutoff state for allowing electric current flow only in the storage capacitor 24 side and not to flow in the organic EL device 21 side.

Figure 5A:
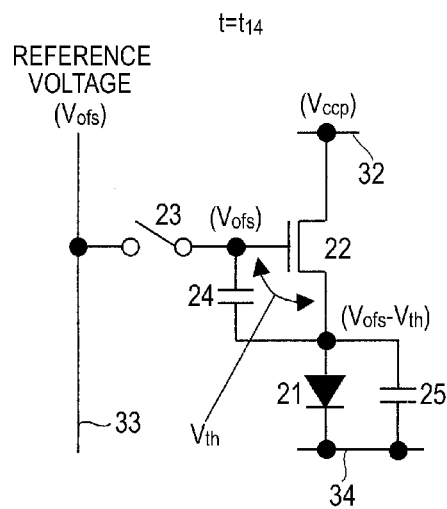
FIGS. 5A to 5D are operation explanation diagrams (No. 2) of basic circuit operations of the organic EL display unit to which the present disclosure is applied.

Next, when the potential WS of the scanning line 31 is changed to the low potential side at a time point "t14", the write transistor 23 becomes non-conductive as shown in FIG. 5A. At this time, the gate electrode of the drive transistor 22 is electrically cut off from the signal line 33 and made to be in a floating state. However, the drive transistor 22 is in the cutoff state as the gate-source voltage $V_{gs}$ is equal to the threshold voltage $V_{th}$ of the drive transistor 22. Therefore, the drain-source current $I_{ds}$ does not flow in the drive transistor 22.

(Signal Writing & Mobility Correction Period)

Figure 5B:
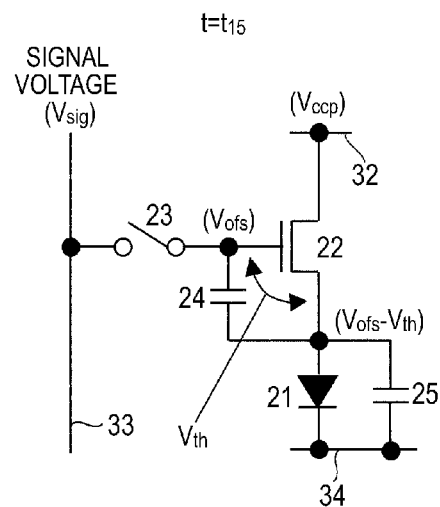
Figure 5C:
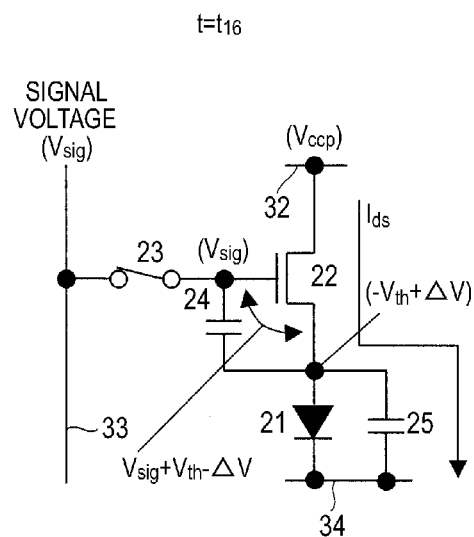

Next, the potential of the signal line 33 is switched from the reference voltage $V_{ofs}$ to the signal voltage $V_{sig}$ of the video signal at a time point "t15" as shown in FIG. 5B. Subsequently, when the potential WS of the scanning line 31 is changed to the high potential side at a time point "t16", the write transistor 23 becomes conductive and performs sampling of the signal voltage $V_{sig}$ of the video signal to be written in the pixel 20 as shown in FIG. 5C.

The gate potential Vg of the drive transistor 22 will be the signal voltage $V_{sig}$ by the writing of the signal voltage $V_{sig}$ by the write transistor 23. Then, the threshold voltage $V_{th}$ of the drive transistor 22 is cancelled out by the voltage corresponding to the threshold voltage $V_{th}$ stored in the storage capacitor 24 when the drive transistor 22 is driven by the signal voltage $V_{sig}$ of the video signal. The details of the principle of threshold cancellation will be described later.

At this time, the organic EL device 21 is in the cutoff state (high-impedance state). Therefore, electric current flowing from the power supply line 32 to the drive transistor 22 (drain-source current $I_{ds}$) in accordance with the signal voltage $V_{sig}$ of the video signal flows into the equivalent capacitor 25 of the organic EL device 21. As a result, charge of the equivalent capacitor 25 of the organic EL device 21 is started.

When the equivalent capacitor 25 of the organic EL device 21 is charged, the source potential Vs of the drive transistor 22 is increased with a lapse of time. At this point, variations of the threshold voltage $V_{th}$ of the drive transistor in respective pixels have been already cancelled out, and the drain-source current $I_{ds}$ of the drive transistor 22 depends on a mobility μ of the drive transistor 22. The mobility μ of the drive transistor 22 is the mobility of a semiconductor thin film forming a channel of the drive transistor 22.

Here, assume that the ratio of the voltage $V_{gs}$ stored in the storage capacitor 24 with respect to the signal voltage $V_{sig}$ of the video signal, namely, a write gain G is 1 (desired value). Then, when the source potential Vs of the drive transistor 22 is increased to a potential of $V_{ofs}-V_{th}+\Delta V$, the gate-source voltage $V_{gs}$ of the drive transistor 22 will be $V_{sig}-V_{ofs}+V_{th}-\Delta V$.

That is, the increased amount $\Delta V$ of the source potential Vs of the drive transistor 22 works so as to be subtracted from the voltage stored in the storage capacitor 24 ($V_{sig}-V_{ofs}+V_{th}$), in other words, so as to discharge the stored charges of the storage capacitor 24. In short, the increased amount $\Delta V$ of the source potential Vs means that negative feedback is given to the storage capacitor 24. Therefore, the increased amount $\Delta V$ of the source potential Vs is a feedback amount of the negative feedback.

As described above, the negative feedback is given to the gate-source voltage Vgs by the feedback amount $\Delta V$ corresponding to the drain-source current $I_{ds}$ flowing in the drive transistor 22, thereby cancelling out dependence of the drain-source current $I_{ds}$ of the drive transistor 22 with respect to the mobility $\mu$. The processing of cancellation corresponds to mobility correction processing which corrects variations of the mobility $\mu$ of the drive transistor 22 in respective pixels.

More specifically, the drain-source current $I_{ds}$ is increased as a signal amplitude $V_{in}$ ($=V_{sig}-V_{ofs}$) of the video signal written in the gate electrode of the drive transistor 22 becomes higher, therefore, an absolute value of the feedback amount $\Delta V$ of negative feedback is also increased. Thus, the mobility correction processing corresponding to the light emission luminance level is performed.

When the signal amplitude $V_{in}$ of the video signal is fixed, the absolute value of the feedback amount $\Delta V$ of negative feedback is increased as the mobility $\mu$ of the drive transistor 22 becomes higher, therefore, variations of the mobility $\mu$ in respective pixels can be cancelled. Thus, the feedback amount $\Delta V$ of negative feedback can be also defined as a correction amount of the mobility correction processing. The details of the principle of mobility correction will be described later.

(Light Emission Period)

Figure 5D:
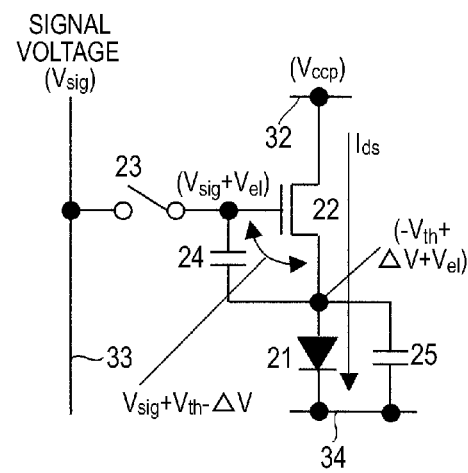

Next, when the potential WS of the scanning line 31 is changed to the low potential side at a time point "t17", the write transistor 23 becomes in the non-conductive state as shown in FIG. 5D. Accordingly, the gate electrode of the drive transistor 22 is electrically cut off from the signal line 33 and becomes in the floating state.

Here, when the gate electrode of the drive transistor 22 is in a floating state, the gate potential Vg varies in conjunction with the variation of the source potential Vs of the drive transistor 22 as the storage capacitor 24 is connected between the gate and the source of the drive transistor 22. An operation in which the gate potential Vg of the drive transistor 22 varies in conjunction with the variation of the source potential Vs as described above is defined as a bootstrap operation by the storage capacitor 24.

When the gate electrode of the drive transistor 22 is in the floating state and the drain-source current $I_{ds}$ of the drive transistor 22 starts to flow in the organic EL device 21 at the same time, an anode potential of the organic EL device 21 is increased according to the current $I_{ds}$.

Then, when the anode potential of the organic EL device 21 exceeds $V_{thel}+V_{cath}$, the organic EL device 21 starts to emit light as drive current starts to flow in the organic EL device 21. The increase of the anode potential of the organic EL device 21 is nothing less than the increase of the source potential Vs of the drive transistor 22. When the source potential Vs of the drive transistor 22 is increased, the gate potential Vg of the drive transistor 22 is increased in conjunction of the source potential Vs due to the bootstrap operation by the storage capacitor 24.

At this time, when assuming that a bootstrap gain is 1 (desired value), the increased amount of the gate potential Vg is equal to the increased amount of the source potential Vs. Therefore, the gate-source voltage $V_{gs}$ of the drive transistor 22 is maintained to be constant at $V_{sig}-V_{ofs}+V_{th}-\Delta V$ during the light emission period. Then, the potential of the signal line 33 is switched from the signal voltage $V_{sig}$ of the video signal to the reference voltage $V_{ofs}$ at a time point "t18".

In the series of circuit operations explained as the above, respective processing operations of the threshold correction preparation, the threshold correction, the writing of the signal voltage $V_{sig}$ (signal writing) and the mobility correction are executed during one horizontal scanning period (1H). The respective processing operations of the signal writing and the mobility correction are executed in parallel during a period between the time points "t16" and "t17".

(Divided Threshold Correction)

The case of applying the drive method of executing the threshold correction processing just once has been explained as an example here, however, the drive method is just an example and is not limited to this. For example, it is possible to apply a drive method, so called a drive method of a divided threshold correction, in which the threshold correction processing is additionally performed plural times separately over plural horizontal scanning periods preceding to the 1H period during which the threshold correction processing is performed with the mobility correction and the signal writing processing.

According to the drive method of the divided threshold correction, sufficient time can be secured as the threshold correction periods over plural horizontal scanning periods even when time to be assigned to one horizontal scanning period is reduced due to the increase of pixels accompanied by high definition of the device. Thus, the time can be secured as the threshold correction periods even when the time to be assigned to one horizontal scanning period is reduced, therefore, the threshold correction processing can be positively executed.

(Principle of Threshold Cancellation)

Here, the principle of threshold cancellation (namely, threshold correction) of the drive transistor 22 will be explained. The drive transistor 22 operates as a constant current source as it is designed to be operated in the saturation region. Thus, the constant drain-source current (drive current) $I_{ds}$ given by the following expression (1) is supplied to the organic EL device 21 from the drive transistor 22.

$$I_{ds}=(1/2)\cdot\mu(W/L)C_{ox}(V_{gs}-V_{th})^2 \tag{1}$$

Here, W represents a channel width of the drive transistor 22, L represents a channel length and $C_{ox}$ represents a gate capacitance per a unit area.

Figure 6A:
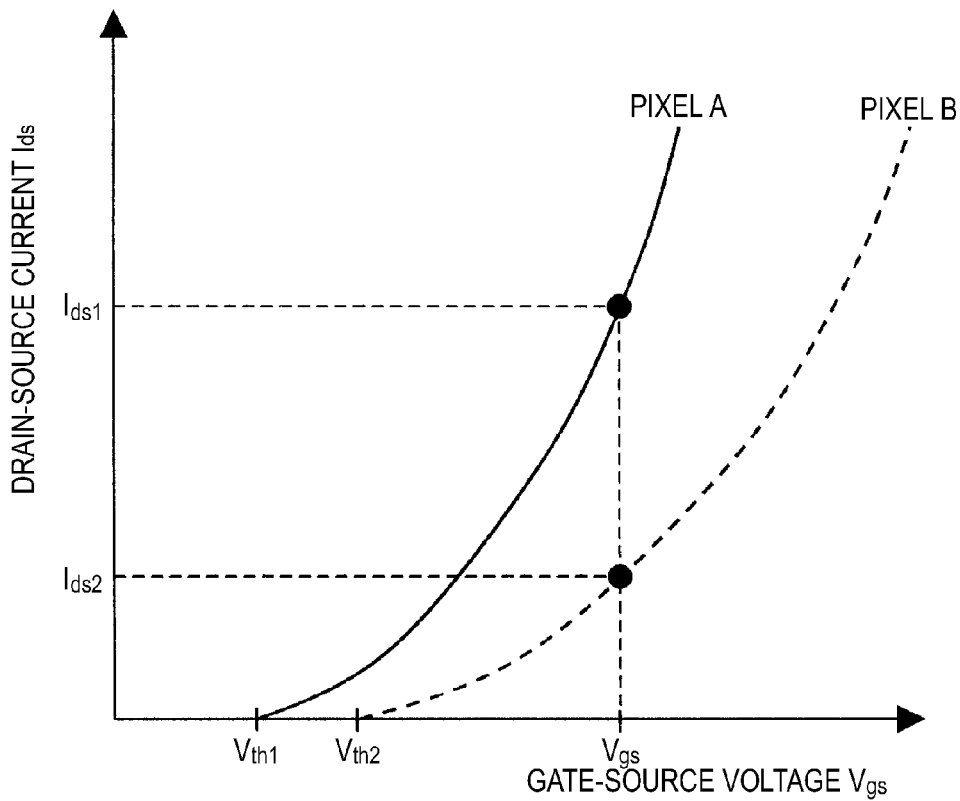
FIGS. 6A and 6B are characteristic graphs for explaining problems caused by variation of a threshold voltage $V_{th}$ of a drive transistor (FIG. 6A) and problems caused by variation of a mobility μ of the drive transistor.

FIG. 6A shows characteristics between the drain-source current $I_{ds}$ and the gate-source voltage $V_{gs}$ in the drive transistor 22. As shown in a characteristic graph of FIG. 6A, if cancellation processing (correction processing) with respect to variations of the threshold voltage Vth of the drive transistor 22 in respective pixels is not performed, the drain-source current Ids corresponding to the gate-source voltage $V_{gs}$ will be $I_{ds1}$ when the threshold voltage $V_{th}$ is $V_{th1}$.

When the threshold voltage $V_{th}$ is $V_{th2}$ ($V_{th2}>V_{th1}$), the drain-source current $I_{ds}$ corresponding to the same gate-source voltage $V_{gs}$ will be $I_{ds2}$ ($I_{ds2}<I_{ds1}$). That is, when the threshold voltage $V_{th}$ of the drive transistor 22 varies, the drain-source current $I_{ds}$ also varies even when the gate-source voltage $V_{gs}$ is fixed.

On the other hand, the gate-source voltage $V_{gs}$ of the drive transistor 22 during light emission is $V_{sig}-V_{ofs}+V_{th}-\Delta V$ in the pixel (pixel circuit) 20 having the above configuration as described above. Thus, when the above is substituted into the expression (1), the drain-source current $I_{ds}$ is represented by the following expression (2).

$$I_{ds} = (1/2) \cdot \mu(W/L) C_{ox} (V_{sig} - V_{ofs} - \Delta V)^2 \qquad (2)$$

That is, a term of the threshold voltage $V_{th}$ of the drive transistor 22 is cancelled out, and the drain-source current $I_{ds}$ supplied from the drive transistor 22 to the organic EL device 21 does not depend on the threshold voltage $V_{th}$ of the drive transistor 22. As a result, the drain-source current $I_{ds}$ does not vary even when the threshold voltage $V_{th}$ of the drive transistor 22 varies in respective pixels due to variations in manufacturing processes of the drive transistor 22, variations with time and so on, therefore, light emission luminance of the organic EL device 21 can be maintained to be constant.

(Principle of Mobility Correction)

Figure 6B:
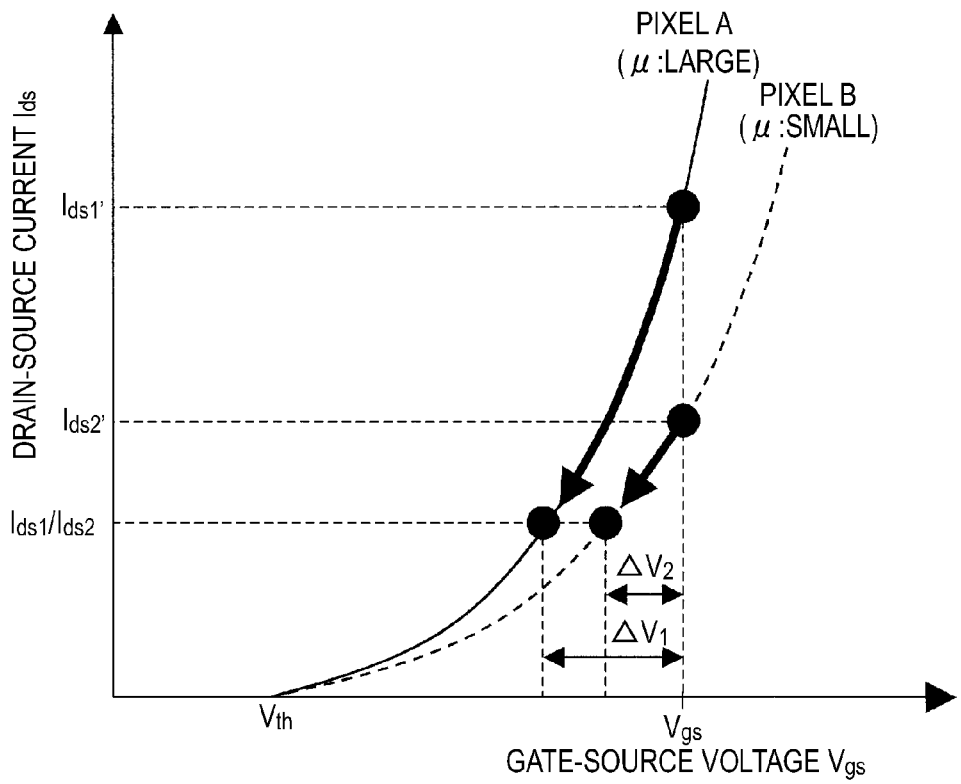

Next, the principle of mobility correction of the drive transistor 22 will be explained. FIG. 6B shows characteristic curves obtained by comparing a pixel A the drive transistor 22 of which has relatively high mobility μ with a pixel B the drive transistor 22 of which has relatively low mobility μ. When the drive transistor 22 is made of a polysilicon thin transistor and the like, it is inevitable that the mobility μ varies between pixels such as in the pixel A and the pixel B.

Let us consider the case, for example, where the signal amplitude $V_{in}$ ($=V_{sig}-V_{ofs}$) in the same level is written to the gate electrodes of the drive transistors 22 in both pixels A and B in a state in which the mobility μ varies between the pixel A and the pixel B. In this case, if no correction of the mobility μ is made, large difference occurs between a drain-source current $I_{ds1}'$ flowing in the pixel A having higher mobility μ and a drain-source current $I_{ds2}'$ flowing in the pixel B having lower mobility μ. When the large difference occurs in the drain-source current $I_{ds}$ between pixels due to variations of mobility μ in respective pixels as described above, uniformity of the screen is reduced.

Here, as apparent from the transistor characteristic expression of the expression (1), the drain-source current $I_{ds}$ is increased when the mobility μ is high. Therefore, the higher the mobility μ is, the larger the feedback amount ΔV in negative feedback becomes. As shown in FIG. 6B, a feedback amount $\Delta V_1$ of the pixel A having high mobility μ is larger than a feedback amount $\Delta V_2$ of the pixel B having low mobility μ.

Thus, when negative feedback is given to the gate-source voltage $V_{gs}$ with the feedback amount ΔV corresponding to the drain-source current $I_{ds}$ of the drive transistor 22 by the mobility correction processing, the negative feedback is given with a larger amount as the mobility μ becomes higher. As a result, variations of the mobility μ in respective pixels can be suppressed.

Specifically, when correction is made with the feedback amount $\Delta V_1$ in the pixel A having higher mobility μ, the drain-source current $I_{ds}$ is largely decreased from $I_{ds1}'$ to $I_{ds1}$. On the other hand, the feedback amount $\Delta V_2$ of the pixel B having lower mobility μ is small, therefore, the drain-source current $I_{ds}$ is reduced from $I_{ds2}'$ to $I_{ds2}$, which is not so large decrease. Consequently, the drain-source current $I_{ds1}$ of the pixel A becomes approximately equal to the drain-source current $I_{ds2}$ of the pixel B, therefore, variations of the mobility μ in respective pixels can be corrected.

Summarizing the above mentioned, when there exist the pixel A and the pixel B the mobility μ of which is different, the feedback amount $\Delta V_1$ of the pixel A having larger mobility μ will be larger than the feedback amount $\Delta V_2$ of the pixel B having lower mobility μ. That is, the higher the mobility μ of the pixel is, the larger the feedback amount ΔV is, as well as the larger the decreased amount of the drain-source current $I_{ds}$ becomes.

Therefore, when the negative feedback is given to the gate-source voltage $V_{gs}$ with the feedback amount ΔV corresponding to the drain-source current $I_{ds}$ of the drive transistor 22, current values of the drain-source current $I_{ds}$ in pixels having different mobilities μ are uniformed. As a result, variations of the mobility μ in respective pixels can be corrected. That is, the processing of giving negative feedback to the gate-source voltage $V_{gs}$ of the drive transistor 22, namely, the storage capacitor 24 with the feedback amount (correction amount) ΔV corresponding to current (drain-source current $I_{ds}$) flowing in the drive transistor 22 is defined as the mobility correction processing.

[1-3. Bottom-Emission Structure]

Incidentally, the organic EL display unit 10 having the above configuration applies a bottom-emission structure (method) as a method of taking light emitted by the organic EL devices 21, in which light is taken from the backside of a transparent insulating substrate (for example, a glass substrate) on which pixel circuits each including a TFT, a capacitor element and so on are formed. Here, an example of the bottom-emission structure will be explained.

Figure 7:
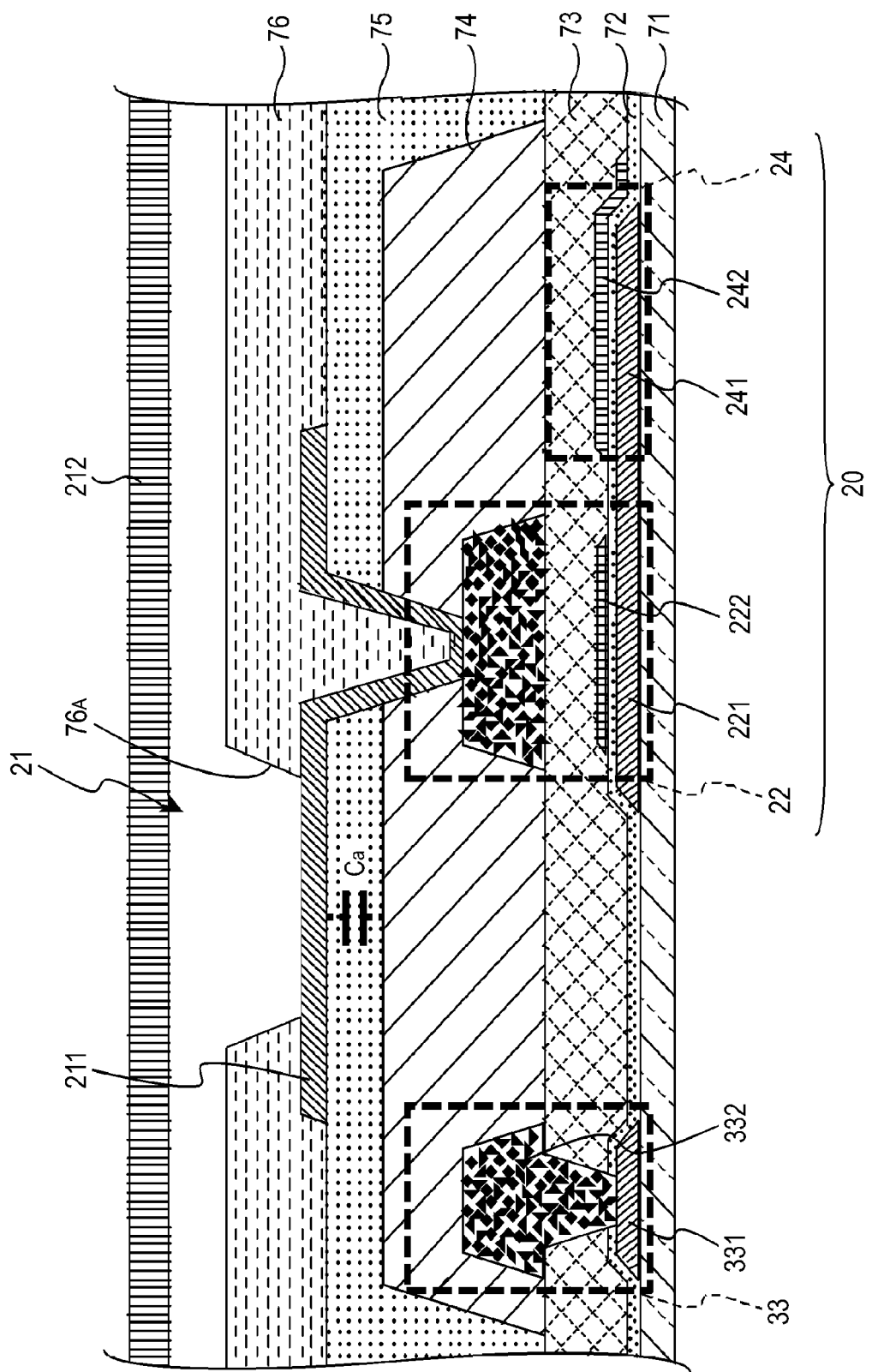
FIG. 7 is a cross-sectional view showing an example of a bottom-emission structure.

FIG. 7 is a cross-sectional view showing an example of the bottom emission structure, and the same signs are put to the same portions as FIG. 2 in the drawing. In FIG. 7, a cross-sectional structure of a region including the drive transistor 22 and the storage capacitor 24 is shown.

As shown in FIG. 7, the pixel circuit (drive circuit of the organic EL device 21) 20 including the drive transistor 22 and the storage capacitor 24 is formed on a transparent insulating substrate, for example, a glass substrate 71. More specifically, a gate electrode 221 of the drive transistor 22, one electrode 241 of the storage capacitor 24 and a lower-layer wiring 331 of the signal line 33 are formed on the glass substrate 71. The glass substrate 71 on which the pixel circuit 20 is formed is generally referred to as a TFT substrate.

On the gate electrode 221 of the drive transistor 22 and one electrode 241 of the storage capacitor 24, a semiconductor layer 222 where a channel region and source/drain regions of the drive transistor 22 are formed and the other electrode 242 of the storage capacitor 24 are formed through an insulating film 72. On the pixel circuit 20, a color filter 74 is directly, namely, formed in an on-chip manner through an insulating planarization film 73. That is, the color filter 74 is an on-chip color filter.

On the insulating planarization film 73, an upper-layer wiring 332 of the signal line 33 is formed to be connected to the lower-layer wiring 331. Additionally, an interlayer insulating film 75 is formed on the color filter 74 and an anode electrode 211 of the organic EL device 21 is formed on the interlayer insulating film 75 pixel by pixel. The organic EL device 21 is provided at a recessed portion $76_A$ of a window insulating film 76 stacked on the interlayer insulating film 75. Furthermore, a cathode electrode 212 of the organic EL device 21 is formed in common with all pixels.

Here, the organic EL display unit 10 according to the application example applies white organic EL devices emitting white light as the organic EL devices 21 to thereby obtain, for example, light emission colors RGB of respective sub-pixels by the on-chip color filters 74. As the white organic EL device, for example, an organic EL device having a tandem structure in which respective organic EL devices of RGB are formed in multi-stages, more specifically, in which respective light emitting layers of RGB are stacked through connection layers.

As described above, the bottom-emission structure is a structure of taking light emitted from the organic EL devices 21 from the backside of the glass substrate 71 on which the pixel circuits 20 are formed. In the bottom-emission structure, regions from which light is taken are limited due to existence of circuit components, wiring and the like on the glass substrate, therefore, the utilization ratio of emitted light of the organic EL devices 21 is generally reduced as compared with a top-emission structure which takes light from the front side of the substrate.

However, in the organic EL display unit 10 according to the application example, the pixel circuit 20 has a circuit configuration including two transistors (22, 23) and one capacitor device (24). Accordingly, the number of transistors and the number of wirings formed on the TFT substrate (glass substrate 71) can be reduced, therefore, there is an advantage that the utilization ratio of emitted light of the organic EL devices 21 can be improved as compared with pixel circuits having three or more transistors and so on when the bottom-emission structure is applied.

[1-4. Problems Caused by Variation of Internal Resistance of a Color Filter]

In the above organic EL display unit 10 having the bottom-emission structure, internal resistance of the color filter 74 may vary by receiving light emission of a self-pixel when light emitted from the organic EL device is transmitted through the color filter 74 according to a material of the color filter 74. The pixel circuit 20 is formed under the color filter 74 in the bottom-emission organic EL display unit 10, therefore, variation of internal resistance in the color filter 74 affects circuit operations of the pixel circuit 20 when the internal resistance of the color filter 74 varies.

Problems caused by variation of internal resistance of color filter 74 will be specifically explained with reference to an equivalent circuit of the color filter 74 shown in FIG. 8.

Figure 8:
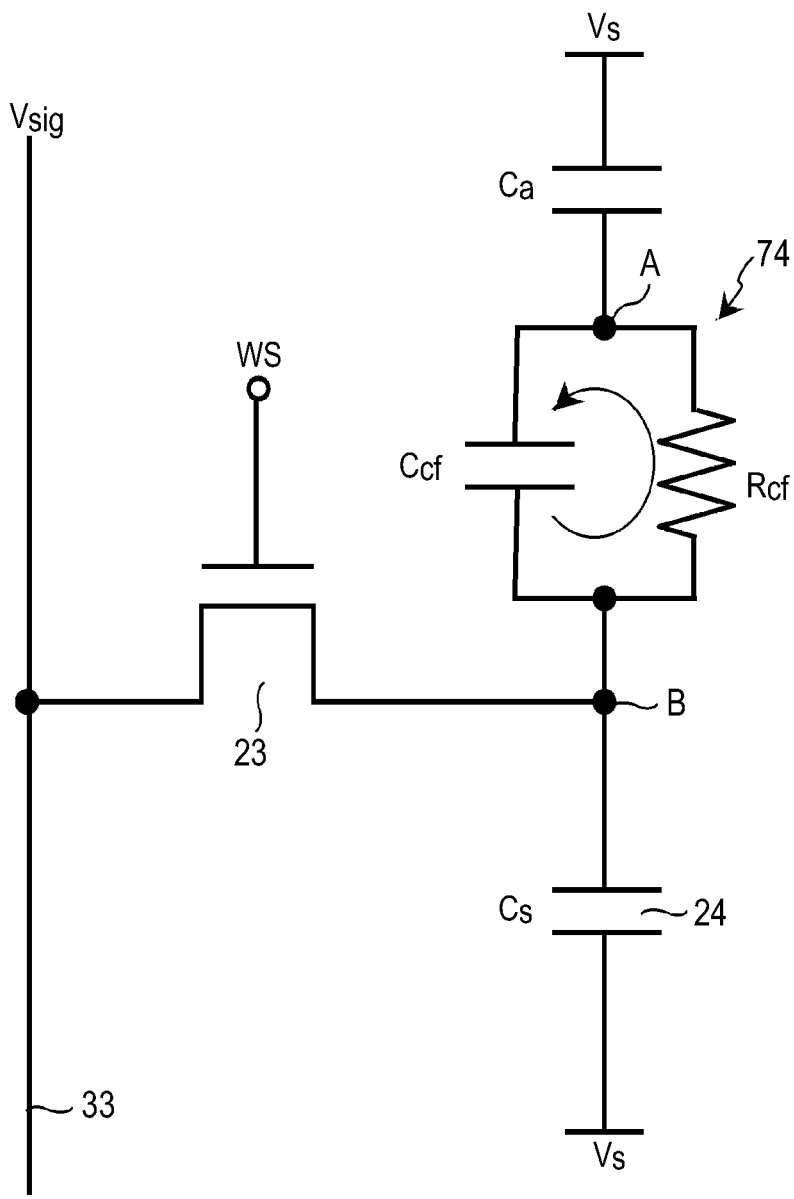
FIG. 8 is a circuit diagram showing an equivalent circuit of a color filter.

As shown in FIG. 8, the color filter 74 can be equivalently shown as a parallel circuit of a capacitive component $C_{cf}$ and an impedance component $R_{cf}$. FIG. 8 shows extracted circuit components of the write transistor 23 and the storage capacitor 24 in addition to the equivalent circuit of the color filter 74, for simplifying the drawing.

In FIG. 8, "Ca" represents a capacitive component parasitizing between the color filter 74 and the anode electrode 211 of the organic EL device 21 (see FIG. 7) and "Cs" represents the storage capacitor 24. "Vs" represents the source potential of the drive transistor 22.

Figure 9:
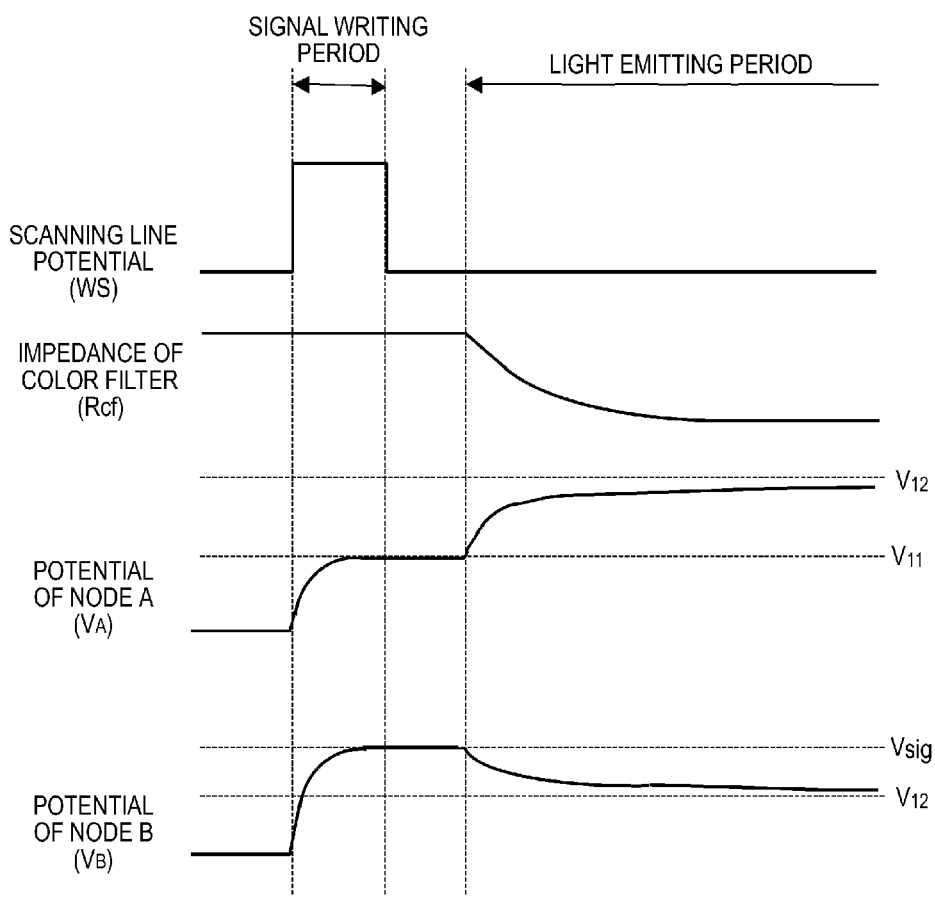
FIG. 9 is a timing waveform diagram for explaining problems caused by variation of internal resistance of the color filter.

Here, the signal writing period and the light emission period are explained in a separated manner which is different from the above-described actual driving with reference to a timing waveform diagram shown in FIG. 9 for making the explanation easy to understand.

As shown in FIG. 9, in the signal writing period, when the potential of the scanning line 31 (writing scanning signal) WS is transited to the high potential side and the write transistor 23 becomes in the conductive state in response to the transition, the signal voltage $V_{sig}$ of the video signal is written to a node B. Here, the node B is a node to which the gate electrode of the drive transistor 22 and one electrode of the storage capacitor 24 are connected in common in the pixel circuit shown in FIG. 2.

When the signal voltage $V_{sig}$ is written to the node B, the potential $V_A$ of a node A will be a potential defined by the following expression.

$$V_A = V_{11} = (V_{sig} - V_s) C_{cf}/(C_{cf} + C_a) \quad (3)$$

During the non-emission period, namely, when light emission of a self-pixel is not received, impedance of the color filter 74 is extremely high, therefore, respective potentials $V_A$ and $V_B$ of the nodes A and B do not vary. However, when the organic EL device 21 emits light and light is irradiated on the color filter 74, that is, when light emission of the self-pixel is received, leak current flows inside the color filter 74 as the impedance (internal resistance) of the color filter 74 is reduced. Thus, the potential $V_A$ of the node A is increased, whereas the potential $V_E$ of the node B is reduced.

As shown in the timing waveform diagram of FIG. 9, respective potentials $V_A$ and $V_E$ of notes A and B vary so as to be the same potential in the end. The final potential $V_{12}$ of the respective potentials $V_A$ and $V_E$ of notes A and B is defined by the following expression.

$$V_{12} = V_s + \{(V_{sig} - V_s)(C_{cf} C_s + C_s C_a + C_a C_{cf})\}/(C_s + C_a)(C_{cf} + C_a) \quad (4)$$

As described above, the internal resistance of the color filter 74 varies by receiving light emission of the self-pixel and charges stored in the storage capacitor 24 are leaked due to the effect of the resistance variation, as a result, the potential $V_B$ of the node B, namely, the gate potential Vg of the drive transistor 22 is reduced. Then, when the gate potential Vg of the drive transistor 22 is reduced, drive current to be supplied to the organic EL device 21 by the drive transistor 22 is reduced as compared with the case where the internal resistance of the color filter 74 does not vary, therefore, light emission luminance of the pixel 20 is largely reduced.

2. Explanation of an Embodiment

Consequently, the organic EL display unit 10 having the bottom-emission structure (method) applies the following structure for suppressing adverse effect caused by variation of internal resistance of the color filter 74 with respect to circuit operations of the pixel circuit 20.

That is, in the organic EL display unit 10 configured by applying the bottom-emission structure and being provided with the color filter on the pixel circuit 20, metal wiring is formed so as to surround the periphery of the color filter 74. The metal wiring is set to the anode potential of the organic EL device 21.

The color filter 74 can be equivalently shown as the parallel circuit of the capacitive component $C_{cf}$ and the impedance component $R_{cf}$ as described above. Then, when the periphery of the color filter 74 is surrounded by the metal wiring set to the anode potential, both terminals of the equivalent circuit of the color filter 74 have electrically the same potential. Therefore, even when the internal resistance of the color filter 74 varies by receiving light emission of the self-pixel, the variation of the internal resistance of the color filter 74 does not affect the circuit operations of the pixel circuit as both terminals of the equivalent circuit have the same potential.

[2-1. Pixel Configuration According to the Embodiment]

Hereinafter, the pixel configuration of an organic EL display unit according to the embodiment will be specifically explained with reference to FIG. 10 to FIG. 12.

Figure 10:
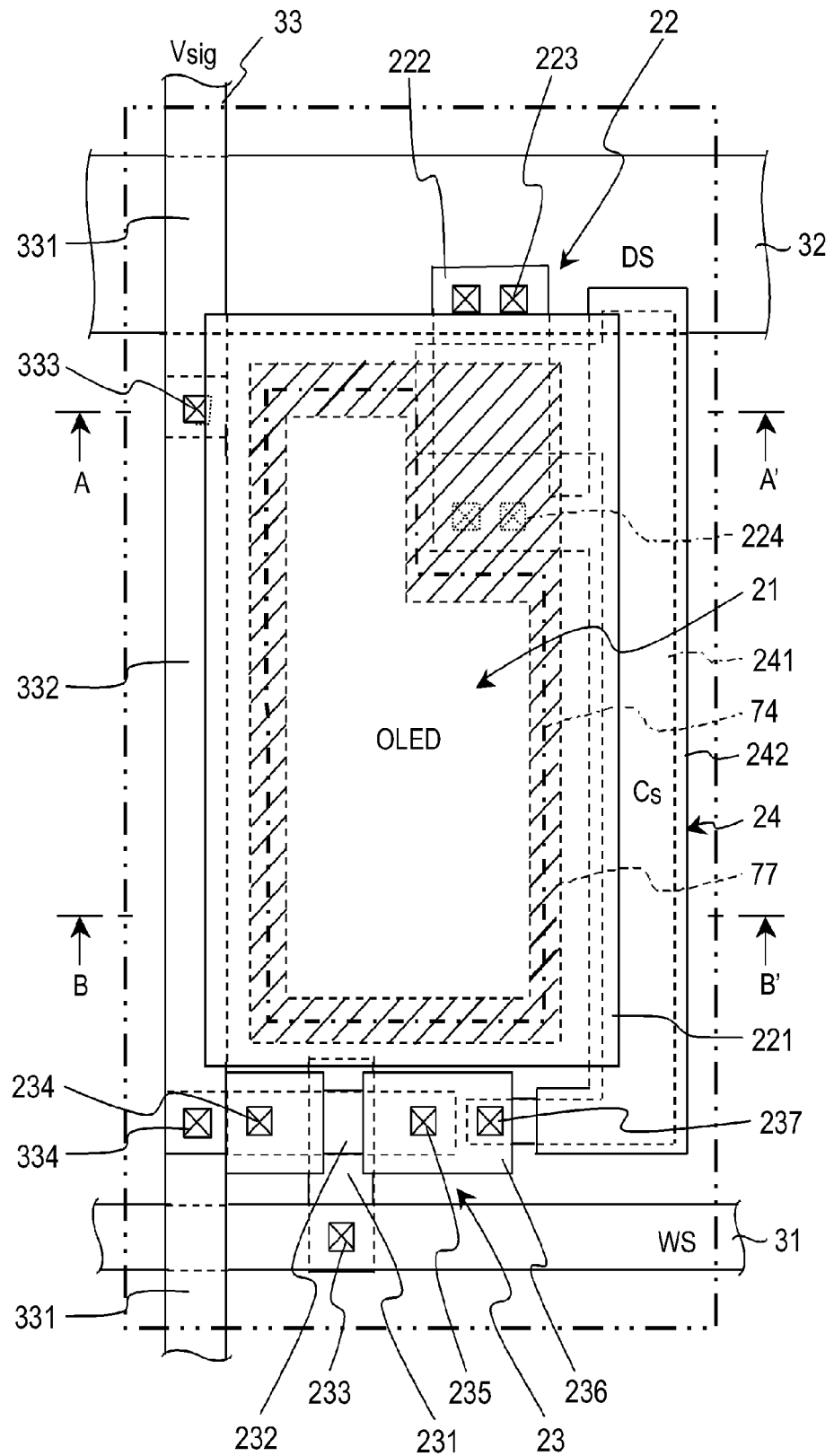
FIG. 10 is a plan view showing an example of a pixel configuration in an organic EL display unit according to an embodiment.

FIG. 10 is a plan view showing an example of a pixel structure in the organic EL display unit according to the embodiment. FIG. 11 is an arrow cross-sectional view taken along A-A' line of FIG. 10 and FIG. 12 is an arrow cross-sectional view taken along B-B' line of FIG. 10. In FIG. 10 to FIG. 12, the same signs are put to portions equivalent to FIG. 2 and FIG. 7.

The organic EL display unit according to the embodiment has the bottom-emission structure in the pixel 20 in the same manner as the case of the organic EL display unit 10 according to the above application example. The bottom-emission structure of the pixel 20 is basically the same structure as the bottom emission structure shown in FIG. 7.

Figure 11:
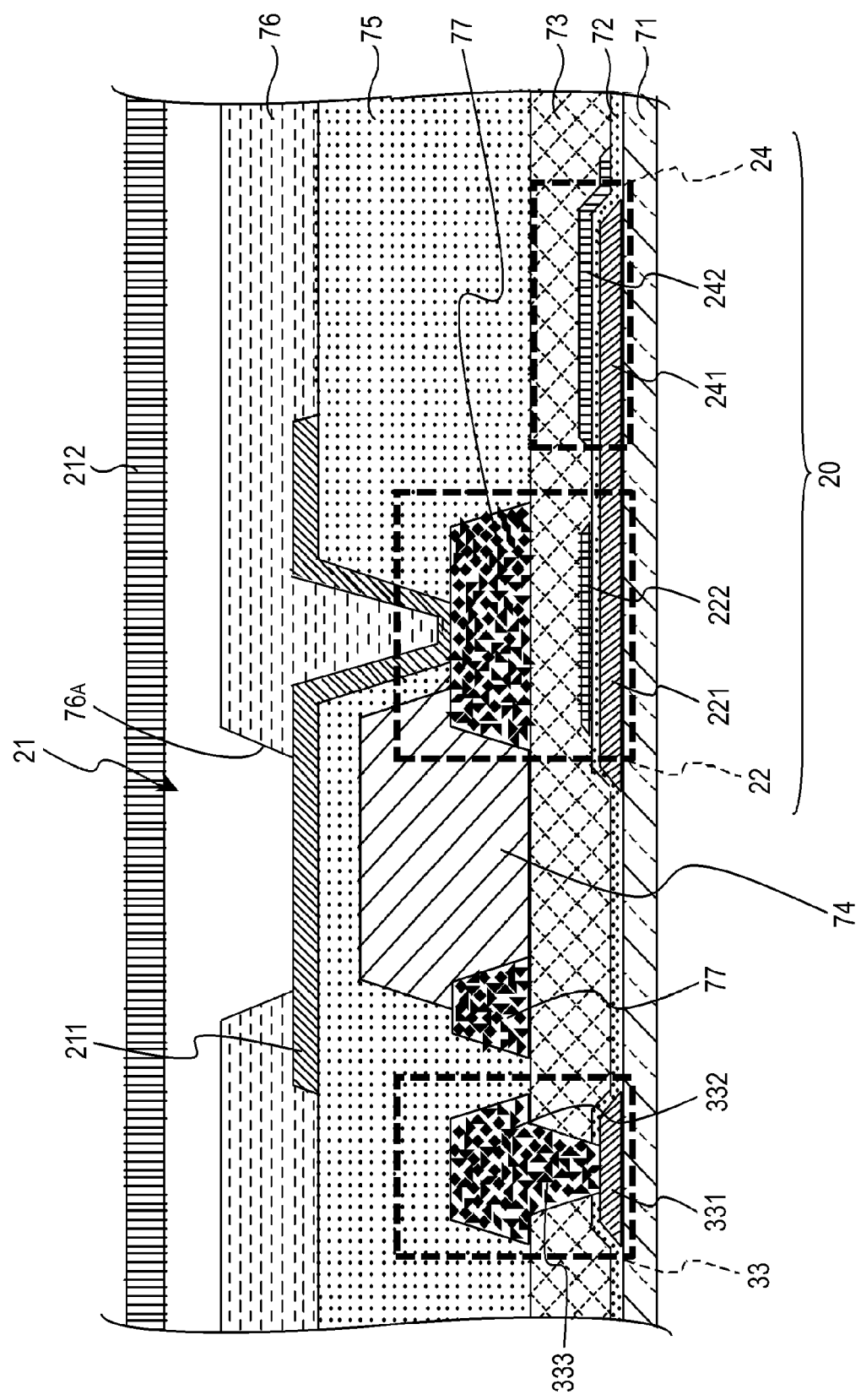
FIG. 11 is an arrow cross-sectional view taken along A-A' line of FIG. 10.
Figure 12:
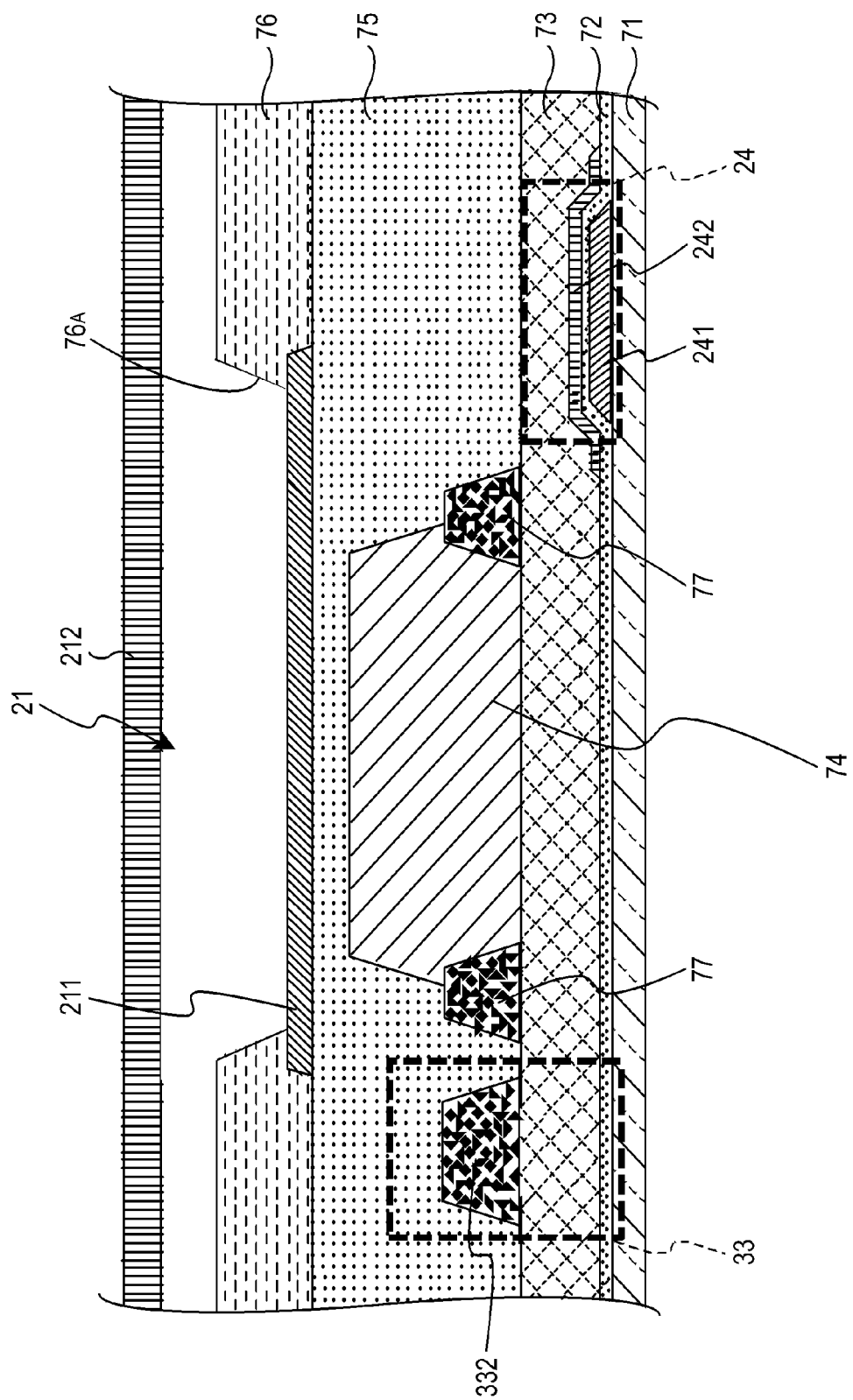
FIG. 12 is an arrow cross-sectional view taken along B-B' line of FIG. 10.

Specifically, as shown in FIG. 11 and FIG. 12, the gate electrode 221 of the drive transistor 22, one electrode (hereinafter referred to as "lower electrode") 241 of the storage capacitor 24 and the lower-layer wiring 331 of the signal line 33 are formed on, for example, the glass substrate 71 called the TFT substrate. As a material for the gate electrode 221 of the drive transistor 22, one electrode 241 of the storage capacitor 24 and the lower-layer wiring 331 of the signal line 33, for example, molybdenum (Mo) and the like can be used.

On the gate electrode 221 of the drive transistor 22 and one electrode 241 of the storage capacitor 24, the semiconductor layer 222 where the channel region and the source/drain regions of the drive transistor 22 are formed and the other electrode (hereinafter referred to as "upper electrode") 242 of the storage capacitor 24 are formed through the insulating film 72. On the pixel circuit 20 including the drive transistor 22 and the storage capacitor 24, the color filter 74 is formed directly, namely, as the on-chip color filter through the insulating planarization film 73.

On the insulating planarization film 73, the upper-layer wiring 332 of the signal line 33 and a contact 223 portion of the transistor 22 are formed. As a material for the upper-layer wiring 332 of the signal line 33 and the contact portion 223 of the transistor 22, for example, aluminum (Al) and the like can be used.

Additionally, the interlayer insulating film 75 is formed on the color filter 74 and the anode electrode 211 of the organic EL device 21 is formed on the interlayer insulating film 75 pixel by pixel. The organic EL device 21 is provided at the recessed portion $76_A$ of the window insulating film 76 stacked on the interlayer insulating film 75. The organic EL device 21 is, for example, the white organic EL device, and the cathode electrode 212 thereof is formed in common with all pixels.

Particularly apparent from FIG. 10, the signal line 33 including the lower-layer wiring 331 and the upper-layer wiring 332 is arranged on the left-end side in the pixel (pixel circuit) 20 along a longitudinal direction of the pixel 20. The lower-layer wiring 331 and the upper-layer wiring 332 are electrically connected by contact portions 333 and 334 at two points in the pixel 20.

The power supply line 32 is wired on the top-end side in the pixel 20 along a lateral direction of the pixel 20. The drive transistor 22 is formed in the vicinity of the power supply line 32. The drive transistor 22 includes the gate electrode 221 formed on the glass substrate 71 and the semiconductor layer 222 to be the channel region and the source/drain regions which are formed above the gate electrode 221 through the insulating film 72 as described above.

In the drive transistor 22, the gate electrode 221 is integrally formed with the lower electrode 241 of the storage capacitor 24. One source/drain region of the semiconductor layer 222 is electrically connected to the upper electrode 242 of the storage capacitor 24 by a contact portion 224. The other source/drain region of the semiconductor layer 222 is electrically connected to the power supply line 32 through the contact portion 223.

The storage capacitor 24 configured by using the insulating film 72 as a dielectric and by sandwiching the insulating 72 by the lower electrode 241 and the upper electrode 242 is formed on the right-end side of the pixel 20 over a large region along the longitudinal direction of the pixel 20. In the storage capacitor 24, a capacitance value is defined by an area of a region where the lower electrode 241 faces the upper electrode 242, a distance between both electrodes 241 and 242 and dielectric constant of the insulating film 72.

The scanning line 31 is wired along the lateral direction of the pixel 20 on the lower-end side in the pixel 20. The write transistor 23 is formed in the vicinity of the scanning line 31. The write transistor 23 includes a gate electrode 231 formed on the glass substrate 71 and a semiconductor layer 232 to be a channel region and source/drain regions which are formed above the gate electrode 231 through the insulating film 72.

In the write transistor 23, the gate electrode is electrically connected to the scanning line 31 by a contact portion 233. One source/drain region of the semiconductor layer 232 is electrically connected to the signal line 33 by a contact portion 234. The other source/drain region of the semiconductor layer 232 is electrically connected to the lower electrode 241 of the storage capacitor 24 through a contact portion 235, a metal wiring 236 and a contact portion 237.

The lower electrode 241 of the storage capacitor 24 is integrally formed with the gate electrode 221 of the drive transistor 22 as described above. Thus, when the other source/drain region of the write transistor 23 is connected to the lower electrode 241 of the storage capacitor 24, the other source/drain region of the write transistor 23 is electrically connected to the gate electrode 221 of the drive transistor 22.

In the pixel 20, the organic EL device 21 is formed at the central portion surrounded by the signal line 33 on the left side, the storage capacitor 24 on the right side, the power supply line 32 on the upper side and the scanning line 31 on the lower side, namely, in the recessed portion $76_A$ of the window insulating film 76 in a state of avoiding the drive transistor 22. The anode electrode 211 of the organic EL device 21 is electrically connected to the other source/drain region of the drive transistor 22 and the upper electrode 242 of the storage capacitor 24 by the contact portion 224.

The color filter 74 is formed under the organic EL device 21 along an opening of the recessed portion $76_A$ of the window insulating film 76 in a state of avoiding the drive transistor 22. In FIG. 10, the color filter 74 is shown by a dashed dotted line for differentiating the color filter from other components. A metal wiring 77 is formed on the insulating planarization film 73 so as to surround the periphery of the color filter 74. In FIG. 10, the metal wiring 77 is shown with hatching.

It is preferable that the metal wiring 77 is formed along a peripheral portion of the color filter 74. When the metal wiring 77 is formed along the peripheral portion of the color filter 74, a function as a light shielding layer which shields light between pixels can be given to the metal wiring 77. It is preferable that the metal wiring 77 is formed so as to overlap with the peripheral portion of the color filter 74.

Because, the effects of steps to be generated in the peripheral portion in a tapered state at the time of forming the color filter 74 can be suppressed by the overlapping. In this case, the effects of the tapered steps can be positively suppressed by forming the metal wiring 77 so as to overlap with the peripheral portion of the color filter 74 by the thickness of a film of the color filter 74 or more.

The metal wiring 77 is set to the anode potential of the organic EL device 21. In the present embodiment, the metal wiring 77 is electrically connected to one source/drain region of the drive transistor 22 by the contact portion 224. Therefore, the metal wiring 77 can be also defined as wiring of one source/drain region of the drive transistor 22.

Additionally, the anode electrode 211 of the organic EL device 21 and one source/drain region of the drive transistor 22 are connected by the contact portion 224 as described above, therefore, the metal wiring 77 is set to the anode potential of the organic EL element 21 through the contact portion 224.

[2-2. Operation and Effect of the Embodiment]

As described above, the metal wiring 77 is formed so as to surround the periphery of the color filter 74 in the organic EL display unit 10 having the bottom-emission structure. Then, the following operation and effect can be obtained by setting the metal wiring 77 to the anode potential of the organic EL device 21 and shielding the color filter 74.

That is, when the periphery of the color filter 74 is surrounded by the metal wiring 77 set to the anode potential of the organic EL device 21 to thereby shield the color filter 74, both terminals of the equivalent circuit of the color filter 74 will have electrically the same potential. The metal wiring 77 set to the anode potential of the organic EL device 21 can be referred to as shielding wiring. As described above, the color filter 74 can be equivalently shown as the parallel circuit of the of the capacitive component $C_{cf}$ and the impedance component $R_{cf}$.

Figure 13:
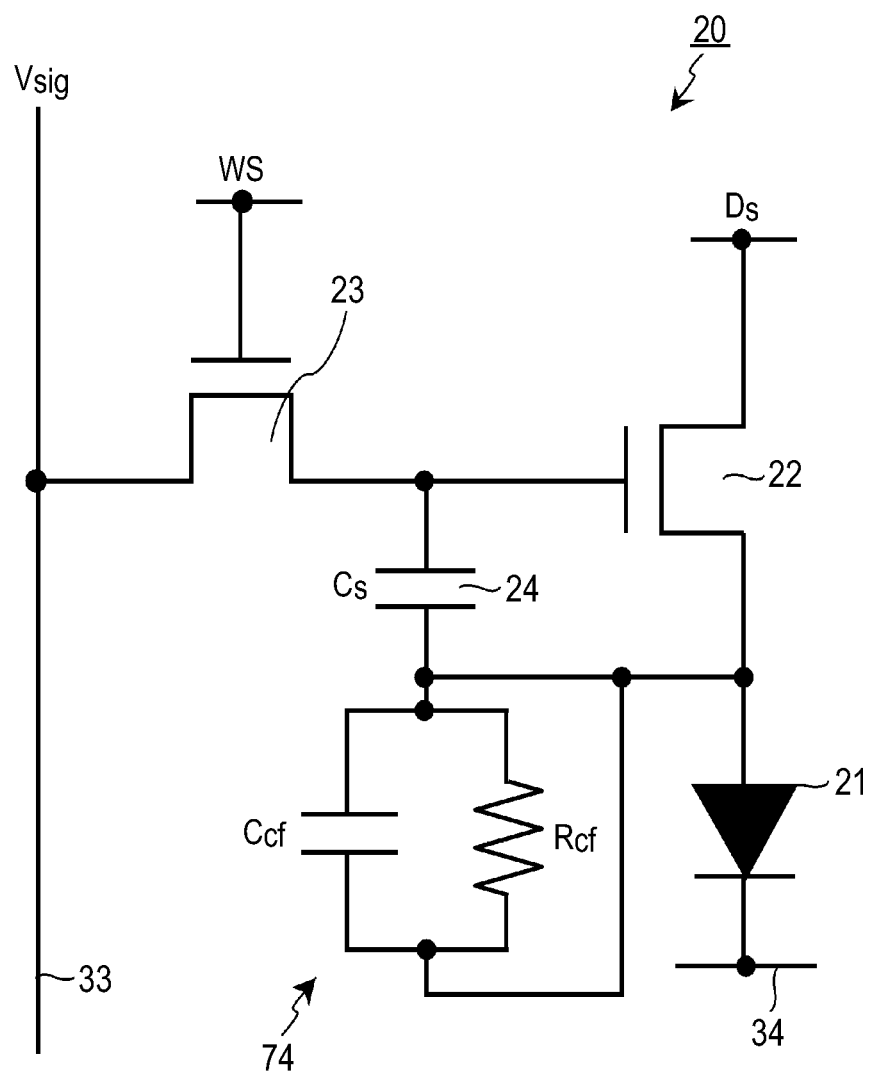
FIG. 13 is a circuit diagram showing an equivalent circuit of the color filter for explaining operation and effect of the embodiment.

The potential of the metal wiring 77 surrounding the periphery of the color filter 74 is the anode potential of the organic EL device 21, therefore, both terminals of the equivalent circuit of the color filter 74 are both connected to the anode electrode of the organic EL device 21 as shown in FIG. 13 when seen from the aspect of the circuit. Therefore, even when light of the self-pixel is irradiated on the color filter 74 and the internal resistance of the color filter 74 varies, charges are not exchanged with the storage capacitor 24 positioned under the color filter 74 as both terminals of the equivalent circuit have the same potential.

That is, when the internal resistance of the color filter 74 varies, charges stored in the storage capacitor 24 are not leaked by the effect of variation. Therefore, the gate potential Vg of the drive transistor 22 is not reduced due to variation of the internal resistance of the color filter 74. As a result, reduction of light emission luminance can be suppressed when the internal resistance of the color filter 74 varies, therefore, good display images can be obtained.

3. Application Example

In the above embodiment, the case where the drive circuit of the organic EL device 21 basically has the circuit configuration including two transistors which are the drive transistor 22 and the write transistor 23 has been explained as the example, however, the present disclosure is not limited to the above circuit configuration.

For example, the present disclosure can be applied to pixel configurations having various circuit configurations such as a circuit configuration in which a light-emission control transistor connected in series to the drive transistor 22 is included while the potential of the power supply line 32 is fixed, and light emission/non-light emission of the organic EL device 21 is controlled by the light-emission control transistor.

As described above, in the organic EL display unit applying the bottom-emission structure, it is preferable, in the light of the utilization ratio of light emission of the organic EL device 21, to apply the circuit configuration of using two transistors as pixel transistors as the number of circuit components can be reduced as described above.

Also in the present disclosure, the case where the white organic EL device is used as the organic EL device 21 has been explained as an example, however, the present disclosure is not limited to the case. That is, in an organic EL display unit using organic EL devices of respective light emission colors RGB as the organic EL devices 21, the color filters may be used, for example, for increasing color purity. Thus, the present disclosure can be applied to all organic EL display units applying the bottom-emission structure and using the color filter.

4. Electronic Apparatus

The above-described organic EL display unit according to the embodiment of the present disclosure can be applied to display sections (display units) of electronic apparatuses in various fields in which video signals inputted to the electronic apparatus or video signals generated in the electronic apparatus are displayed as images or video. As an example, the organic EL display unit can be applied to display sections of various electronic apparatuses shown in FIG. 14 to FIGS. 18A to 18G, for example, a digital camera, a notebook personal computer, portable terminal devices such as a cellular phone, a video camera and so on.

As described above, when the organic EL display unit according to the embodiment of the present disclosure is used as display sections of electronic apparatuses in various fields, thereby improving image quality of display in various types of electronic apparatuses. That is, as apparent from the explanation of the embodiment, the organic EL device unit according to the embodiment of the present disclosure can suppress the reduction of light emission luminance when the internal resistance of the color filter varies. Therefore, good display images with high image quality can be obtained in various types of electronic apparatuses.

The organic EL device according to the embodiment of the present disclosure includes a module-type device with a sealed configuration. As an example, a display module formed by bonding a counter portion made of transparent glass and the like to the pixel array section corresponds to this type. The display module may also be provided with a circuit unit, a FPC (flexible printed circuit) and so on for inputting/outputting signals and so on to the pixel array section from the outside.

Specific examples of electronic apparatuses to which the present disclosure is applied will be explained as follows.

Figure 14:
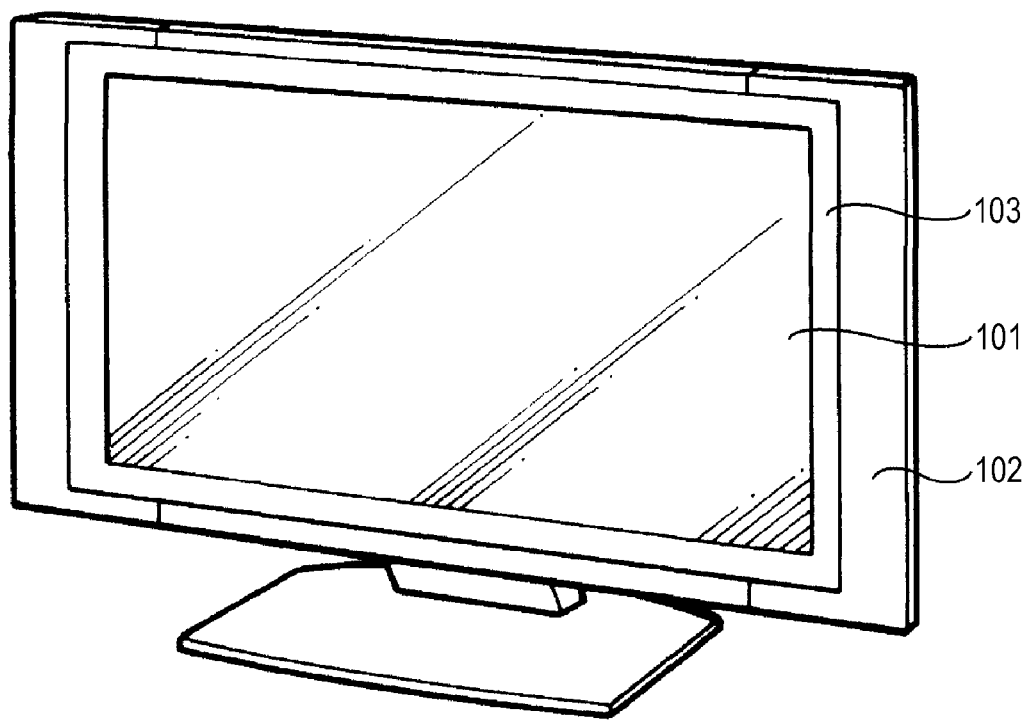
FIG. 14 is a perspective view showing appearance of a television set to which the present disclosure is applied.

FIG. 14 is a perspective view showing appearance of a television set to which the present disclosure is applied. The television set according to the present application example includes a video display screen unit 101 having a front panel 102, a filter glass 103 and so on, which is fabricated by using the organic EL display unit according to the embodiment of the present disclosure as the video display screen unit 101.

Figure 15A:
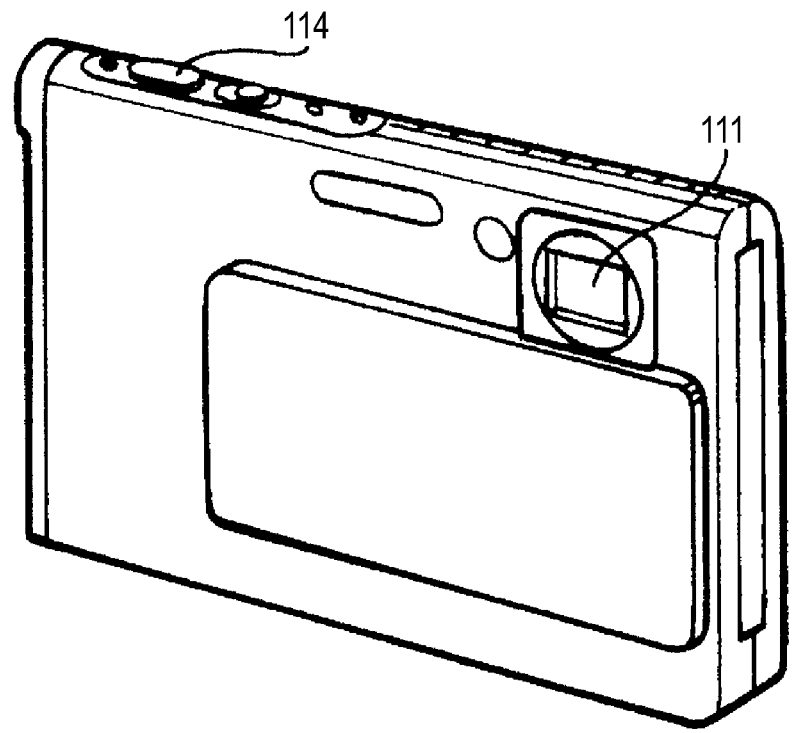
Figure 15B:
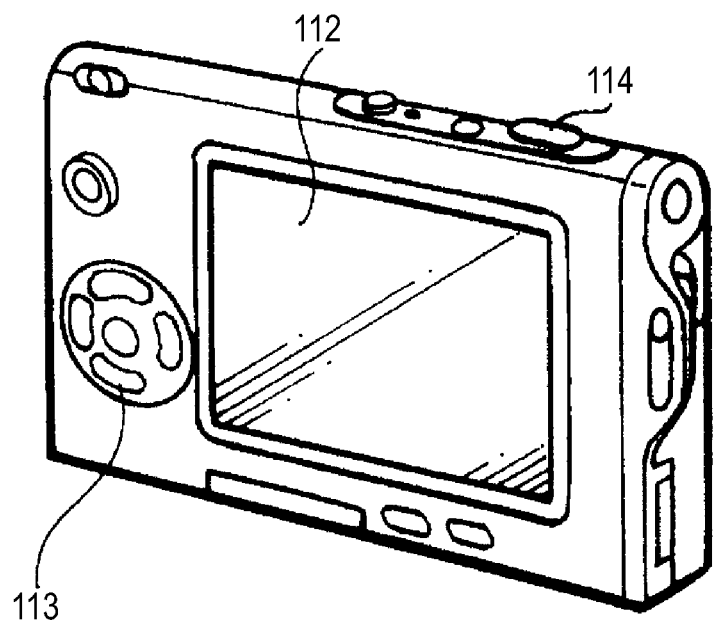

FIGS. 15A and 15B are perspective views showing appearance of a digital camera to which the present disclosure is applied. FIG. 15A is a perspective view seen from the front side and FIG. 15B is a perspective view seen from the back side. The digital camera according to the application example includes a light emitting unit 111 for flash, a display unit 112, a menu switch 113, a shutter button 114 and so on, which is fabricated by using the organic EL display unit according to the embodiment of the present disclosure as the display unit 112.

Figure 16:
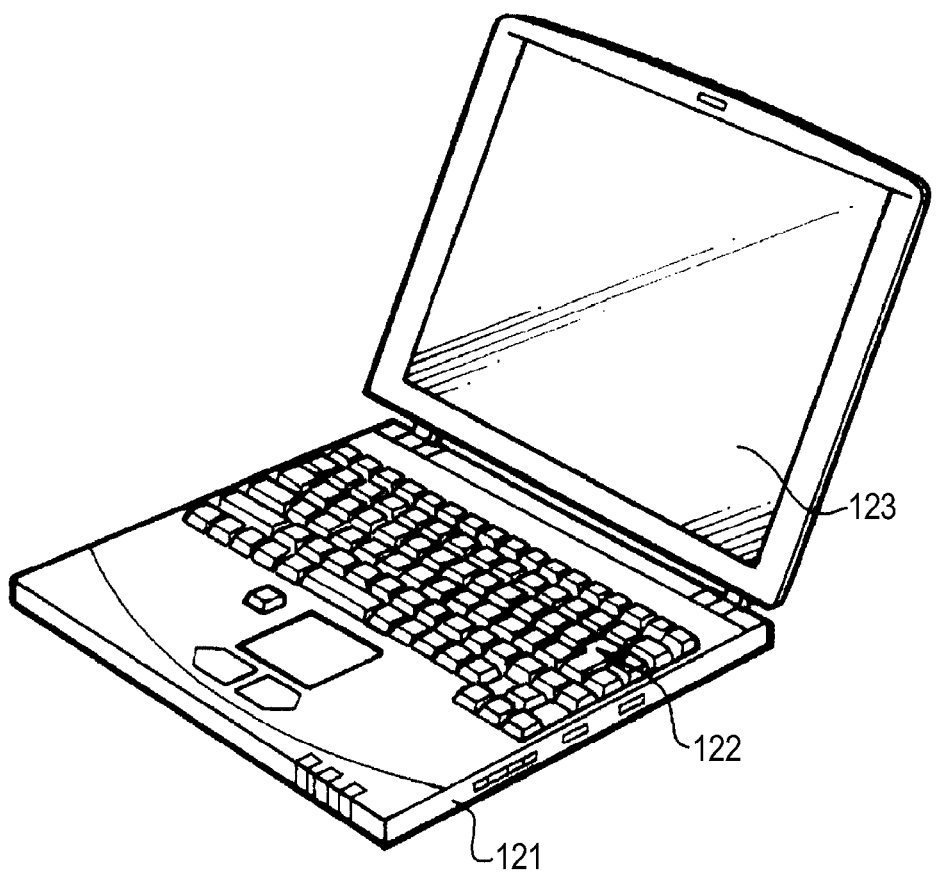
FIG. 16 is a perspective view showing appearance of a notebook personal computer to which the present disclosure is applied.

FIG. 16 is a perspective view showing appearance of a notebook personal computer to which the present disclosure is applied. The notebook personal computer according to the application example includes a keyboard 122 operated when inputting characters and so on in a body 121, a display unit 123 displaying images and so on, which is fabricated by using the organic EL display unit according to the embodiment of the present disclosure as the display unit 123.

Figure 17:
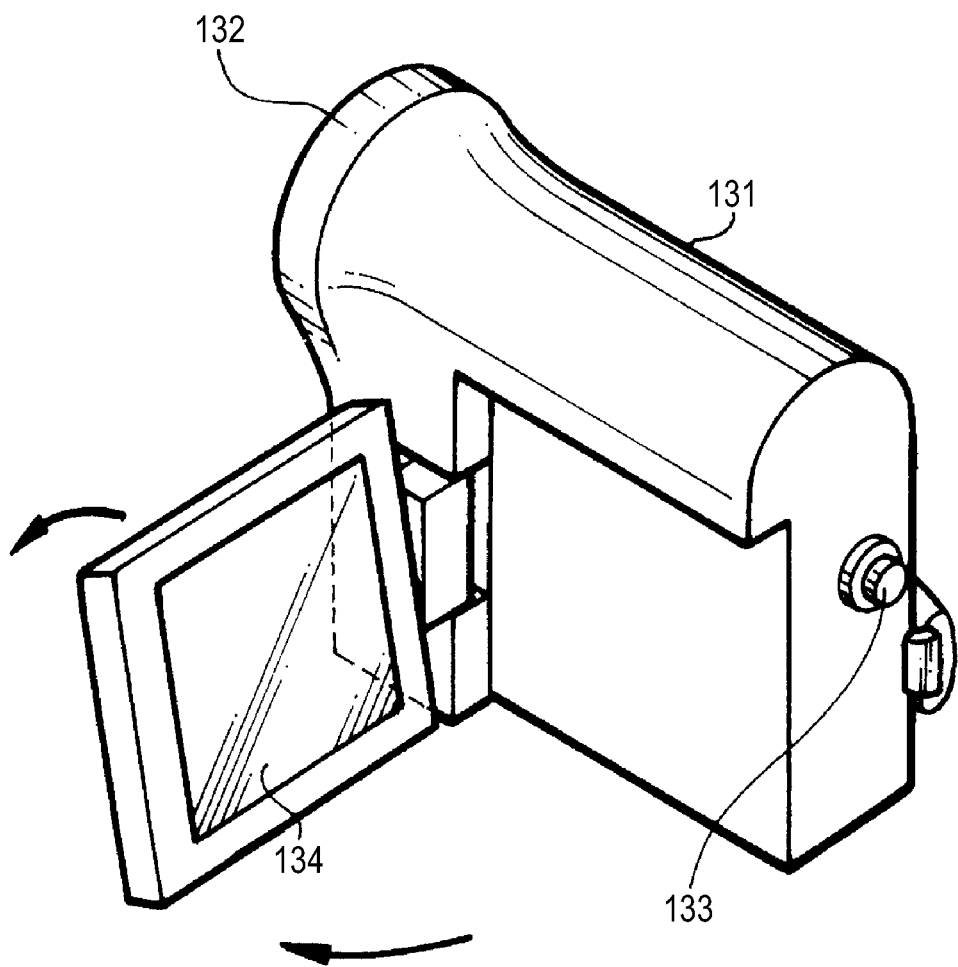
FIG. 17 is a perspective view showing appearance of a video camera to which the present disclosure is applied.

FIG. 17 is a perspective view showing appearance of a video camera to which the present disclosure is applied. The video camera according to the application example includes a body 131, a lens 132 for imaging subjects on a side surface facing the front, a start/stop switch 133 used at the time of imaging, a display unit 134 and so on, which is fabricated by using the organic EL display unit according to the embodiment of the present disclosure as the display unit 134.

FIGS. 18A to 18B are appearance views of a portable terminal device, for example, a cellular phone device to which the present disclosure is applied. FIG. 18A is a front view in an opened state, FIG. 18B is a side view thereof, FIG. 18C is a front view in a closed state, FIG. 18D is a left-side view, FIG. 18E is a right-side view, FIG. 18F is an upper surface view and FIG. 18G is a bottom surface view. The cellular phone device according to the application example includes an upper casing 141, a lower casing 142, a connection portion (a hinge portion in this case) 143, a display 144, a sub-display 145, a picture light 146, a camera 147 and so on. The cellular phone device according to the embodiment the present disclosure is fabricated by using the organic EL display unit according to the embodiment of the present disclosure as the display 144 or the sub-display 145.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL display unit comprising:
    a substrate;
    a pixel circuit;
    an organic EL device configured to emit light to the substrate and formed between an anode electrode and a cathode electrode;
    a color filter formed on the pixel circuit; and
    a metal wiring formed on a peripheral portion surrounding the color filter,
    wherein the metal wiring is connected to an anode electrode.

2. The organic EL display unit according to claim 1, wherein the metal wiring is formed so as to overlap with the color filter.

3. The organic EL display unit according to claim 2, wherein the metal wiring overlaps with the color filter by the thickness of a film of the color filter or more.

4. The organic EL display unit according to claim 1, wherein the pixel circuit includes
    a write transistor;
    a storage capacitor storing a signal voltage written by the write transistor;
    a drive transistor driving the organic EL device based on a stored voltage of the storage capacitor.

5. The organic EL display unit according to claim 1, wherein the metal wiring is formed so as to surround the color filter.

6. The organic EL display unit according to claim 1, wherein the organic EL device is configured to emit white light.

* * * * *